US011913997B2

(12) United States Patent
Mizoguchi

(10) Patent No.: US 11,913,997 B2
(45) Date of Patent: Feb. 27, 2024

(54) VOLTAGE DETECTION APPARATUS

(71) Applicant: DENSO CORPORATION, Kariya (JP)

(72) Inventor: Tomomichi Mizoguchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 361 days.

(21) Appl. No.: 17/459,308

(22) Filed: Aug. 27, 2021

(65) Prior Publication Data

US 2021/0389380 A1 Dec. 16, 2021

Related U.S. Application Data

(63) Continuation of application No. PCT/JP2020/007545, filed on Feb. 25, 2020.

(30) Foreign Application Priority Data

Feb. 28, 2019 (JP) .................. 2019-036809

(51) Int. Cl.
*G01R 31/3835* (2019.01)
*H02J 7/00* (2006.01)

(52) U.S. Cl.
CPC ........ *G01R 31/3835* (2019.01); *H02J 7/0048* (2020.01)

(58) Field of Classification Search
CPC ................................................ G01R 31/3835
See application file for complete search history.

(56) References Cited

U.S. PATENT DOCUMENTS

| 2002/0075004 A1* | 6/2002 | Yudahira | G01R 31/396 324/434 |
| 2016/0061903 A1* | 3/2016 | Deriha | G01R 31/396 324/426 |
| 2020/0271732 A1* | 8/2020 | Shimizu | G01R 19/16576 |

FOREIGN PATENT DOCUMENTS

JP 2016-085130 A 5/2016

* cited by examiner

*Primary Examiner* — Noam Reisner
(74) *Attorney, Agent, or Firm* — Oliff PLC

(57) ABSTRACT

A voltage detection apparatus includes a capacitor and first and second differential voltage detection circuits. A reference voltage supplying unit supplies a first reference voltage from a first output terminal to the first differential voltage detection circuit, and supplies a second reference voltage from a second output terminal to the second differential voltage detection circuit. A fault determining unit determines a fault in the first or second differential voltage detection circuit based on a first voltage that is inputted from a first input terminal and a second voltage that is inputted from the second input terminal. A voltage output circuit is supplied a third reference voltage from a third output terminal between the first output terminal and the second output terminal, and outputs a third voltage to a third input terminal between the first input terminal and the second input terminal.

12 Claims, 13 Drawing Sheets

VOLTAGE DETECTION APPARATUS

CROSS-REFERENCE TO RELATED APPLICATIONS

The present application is a continuation application of International Application No. PCT/JP2020/007545, filed on Feb. 25, 2020, which claims priority to Japanese Patent Application No. 2019-036809, filed on Feb. 28, 2019. The contents of these applications are incorporated herein by reference in their entirety.

BACKGROUND

Technical Field

The present disclosure relates to a voltage detection apparatus.

Related Art

A voltage detection apparatus that is applicable to an assembled battery (also referred to as a battery pack) having a series-connection body of a plurality of battery cells is known. As this type of voltage detection apparatus, for example, a single-flying-capacitor-type voltage detection apparatus is known. This voltage detection apparatus includes a single capacitor and a differential voltage detection circuit that serves as a voltage detection circuit. The capacitor is charged by a voltage of each detection block that is configured by the plurality of battery cells being divided. The differential voltage detection circuit detects a voltage of the capacitor.

SUMMARY

One aspect of the present disclosure provides a voltage detection apparatus that is applicable to an assembled battery that has a series-connection body of a plurality of battery cells. The voltage detection apparatus includes a capacitor, a first differential voltage detection circuit, a second differential voltage detection circuit, a reference voltage supplying unit, a fault determining unit, and a voltage output circuit. The reference voltage supplying supplies a first reference voltage from a first output terminal to the first differential voltage detection circuit, and supplies a second reference voltage from a second output terminal to the second differential voltage detection circuit. The fault determining unit determines a fault in the first or second differential voltage detection circuit based on a first voltage that is inputted from a first input terminal and a second voltage that is inputted from the second input terminal. The voltage output circuit is supplied a third reference voltage from a third output terminal between the first output terminal and the second output terminal, and outputs a third voltage to a third input terminal between the first input terminal and the second input terminal. The third reference voltage is set to a voltage that differs from the first and second reference voltages. The third voltage is set to a voltage that differs from the first and second voltages.

DESCRIPTION OF THE EMBODIMENTS

Figure 1:
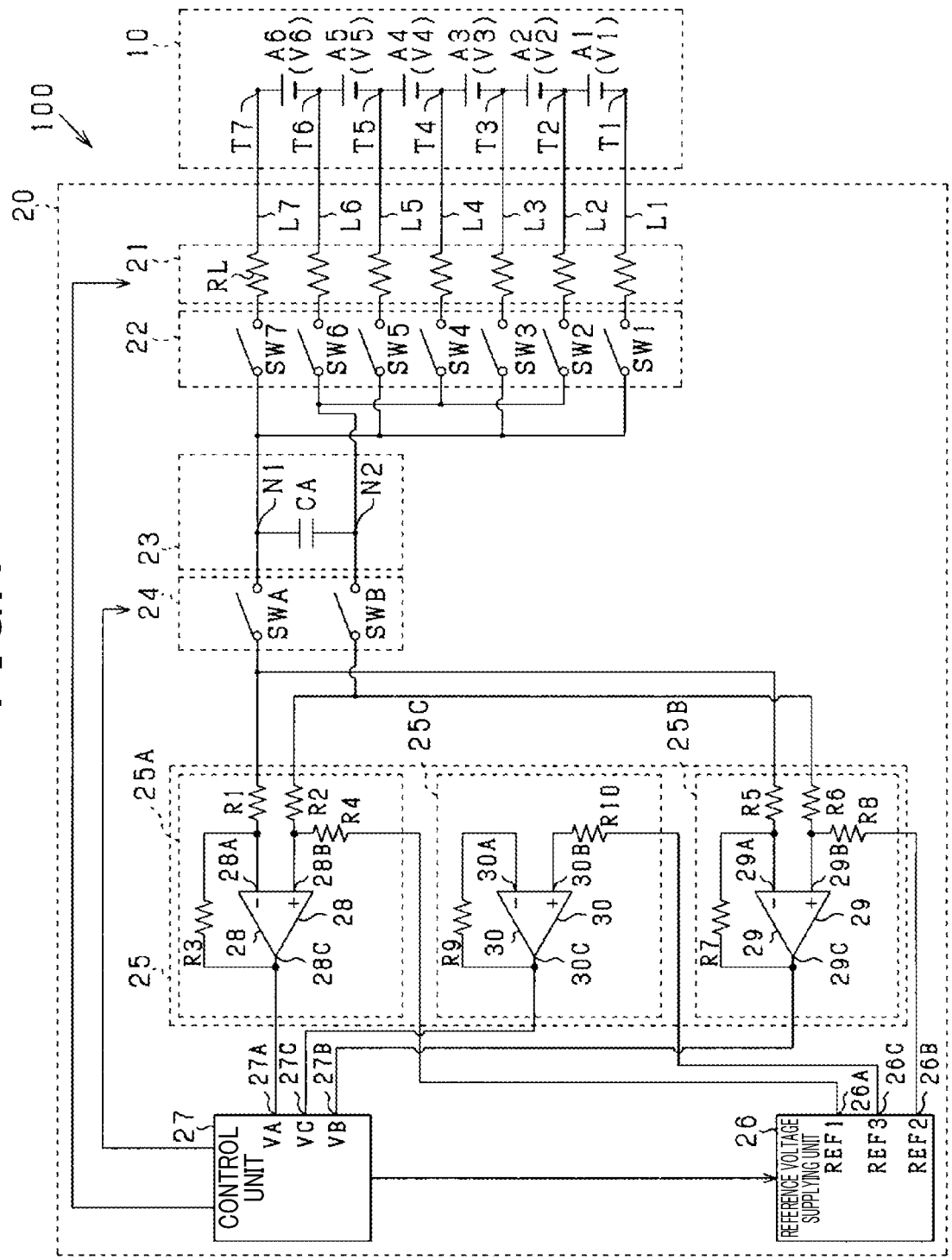
FIG. 1 is a diagram of a power supply system according to a first embodiment.

JP-A-2016-048174 describes a single-flying-capacitor-type voltage detection apparatus. In this voltage detection apparatus, a single capacitor and a differential voltage detection circuit that serves as a voltage detection circuit are provided. The capacitor is charged by a voltage of each detection block that is configured by the plurality of battery cells being divided, and the differential voltage detection circuit detects a voltage of the capacitor.

As the voltage detection apparatus, a dual-system voltage detection apparatus that includes two differential voltage detection circuits for determining a fault in a differential voltage detection circuit is also known. In the dual-system voltage detection apparatus, the differential voltage detection circuits are each used to detect the voltage of the capacitor. When a difference occurs between the detected voltages of the capacitor, a differential voltage detection circuit is determined to be faulty.

However, when a short circuit occurs between the differential voltage detection circuits in the dual-system voltage detection apparatus, the detected voltages of the capacitor may be equal. In this case, a fault in a differential voltage detection circuit cannot be detected.

To determine a fault in a differential voltage detection circuit even when a short circuit has occurred between two differential voltage detection circuits, for example, using a triple-system voltage detection apparatus that includes three differential voltage detection circuits can also be considered. However, in this case, a configuration and control of the voltage detection apparatus become complex, leading to increased cost and lower fault determination speed. A technology that enables a short-circuit fault in a differential voltage detection circuit to be appropriately determined in the dual-system voltage detection apparatus is desired.

It is thus desired to to provide a voltage detection apparatus that is capable of appropriately determining a short-circuit fault in a differential voltage detection circuit.

A first exemplary embodiment provides a voltage detection apparatus that is applicable to an assembled battery that has a series-connection body of a plurality of battery cells.

A plurality of detection blocks are configured by the plurality of battery cells being divided. The voltage detection apparatus includes a capacitor, an input-side switch, a first differential voltage detection circuit, a second differential voltage detection circuit, an output-side switch, a reference voltage supplying unit, a fault determining unit, and a voltage output circuit.

The input-side switch connects the detection block to the capacitor in parallel, and opens and closes between the detection block and the capacitor. The first differential voltage detection circuit detects a voltage of the capacitor and outputs a first voltage based on the voltage of the capacitor. The second differential voltage detection circuit detects the voltage of the capacitor and outputs a second voltage based on the voltage of the capacitor. The output-side switch opens and closes between the capacitor, and the first differential voltage detection circuit and the second differential voltage detection circuit.

The reference voltage supplying unit has a plurality of output terminals, supplies a first reference voltage to the first differential voltage detection circuit from a first output terminal among the plurality of output terminals, and supplies a second reference voltage to the second differential voltage detection circuit from a second output terminal.

The fault determining unit has a plurality of input terminals, in which the first voltage is inputted to a first input terminal among the plurality of input terminals and the second voltage is inputted to a second input terminal, and that determines a fault in the first differential voltage detection circuit or the second differential voltage detection circuit based on the first voltage and the second voltage; and The voltage output circuit is supplied a third reference voltage from a third output terminal that is positioned between the first output terminal and the second output terminal in the reference voltage supplying unit, among the plurality of output terminals, and outputs a third voltage to a third input terminal that is positioned between the first input terminal and the second input terminal in the fault determining unit, among the plurality of input terminals. The third reference voltage is set to a voltage that differs from each of the first reference voltage and the second reference voltage, and the third voltage is set to a voltage that differs from each of the first voltage and the second voltage.

As a result of the above-described configuration, because the third output terminal is positioned between the first output terminal and the second output terminal, occurrence of a short circuit between the first output terminal and the second output terminal can be suitably suppressed. In addition, the third input terminal is positioned between the first and second input terminals. Occurrence of a short circuit between the first input terminal and the second input terminal can be suitably suppressed Meanwhile, for example, the first output terminal and the third output terminal may be short-circuited. However, the first reference voltage and the third reference voltage are set to differing voltages. Therefore, for example, when the first output terminal and the third output terminal are short-circuited, the first reference voltage changes, and the first voltage changes as a result.

In this case, because the second output terminal is not short-circuited, the second voltage does not change. That is, only either voltage of the first voltage and the second voltage changes. Therefore, a fault in the first differential voltage detection circuit can be appropriately determined based on the first voltage and the second voltage. Here, this similarly applies to a short circuit between the second output terminal and the third output terminal, and a short circuit between the first input terminal or the second input terminal and the third input terminal.

According to a second exemplary embodiment, the voltage output circuit is a voltage follower circuit.

Input impedances are substantially equal and output impedances are substantially equal between the differential voltage detection circuit and the voltage follower circuit. As a result of the above-described configuration, for example, when the first output terminal and the third output terminal are short-circuited, the first reference voltage changes to an intermediate voltage of the first reference voltage and the third reference voltage in a non-short-circuited state. Therefore, for example, when a voltage difference between the first reference voltage and the third reference voltage in the non-short-circuited state is large, an amount of change in the first reference voltage can be increased. A fault in the first differential voltage detection circuit can be appropriately determined.

According to a third exemplary embodiment, the first differential voltage detection circuit and the second differential voltage detection circuit have positive-electrode-side input terminals and negative-electrode-side input terminals. The output-side switch connects a first electrode of the capacitor to the negative-electrode-side input terminals of the first differential voltage detection circuit and the second differential voltage detection circuit, and connects a second electrode of the capacitor to the positive-electrode-side input terminals of the first differential voltage detection circuit and the second differential voltage detection circuit.

As a result of the above-described configuration, the first differential voltage detection circuit and the second differential voltage detection circuit operate with the same polarity. Therefore, compared to a case in which the first differential voltage detection circuit and the second differential voltage detection circuit operate with opposite polarities, when the first voltage or the second voltage changes as a result of a fault in the first differential voltage detection circuit or the second differential voltage detection circuit, the change in the voltage can be accurately detected.

According to a fourth exemplary embodiment, the first voltage and the second voltage change within a predetermined output range based on changes in the voltage of the capacitor. The input-side switch connects between the detection block and the capacitor such that a polarity of the voltage of the capacitor switches between a positive polarity and a negative polarity.

The reference voltage supplying unit sets the first reference voltage and the second reference voltage to a voltage on a lower-limit side of the output range and sets the third reference voltage to a voltage on an upper-limit side of the output range when the polarity of the voltage of the capacitor is the positive polarity, and sets the first reference voltage and the second reference voltage to a voltage on the upper-limit side of the output range and sets the third reference voltage to a voltage on the lower-limit side of the output range when the polarity of the voltage of the capacitor is the negative polarity.

As a result of the above-described configuration, compared to a case in which the detection block and the capacitor are connected such that the polarity of the voltage of the capacitor is kept fixed, a configuration of an input-side switch unit can be simplified. This is advantageous in terms of cost reduction.

In addition, in the above-described configuration, when the polarity of the voltage of the capacitor is switched between the positive polarity and the negative polarity, the reference voltages are switched in correspondence thereto. Therefore, a fault in the first differential voltage detection circuit or the second differential voltage detection circuit can be determined regardless of the polarity of the voltage of the capacitor.

Furthermore, when the reference voltages are switched, the first reference voltage and the second reference voltage, and the third reference voltage are set to voltages on opposite sides in relation to the output range. Therefore, an amount of change in the first voltage or the second voltage that occurs as a result of a fault in the first differential voltage detection circuit or the second differential voltage detection circuit can be increased.

According to a fifth exemplary embodiment, the fault determining unit determines that the first differential voltage detection circuit is faulty when a first capacitor voltage that is the voltage of the capacitor calculated using the first voltage is greater than a second capacitor voltage that is the voltage of the capacitor calculated using the second voltage, and determines that the second differential voltage detection circuit is faulty when the first capacitor voltage is less than the second capacitor voltage.

As a result of the above-described configuration, which of the differential voltage detection circuits is faulty can be identified based on a magnitude relationship between the first capacitor voltage and the second capacitor voltage. Consequently, this is advantageous for replacement of a faulty differential voltage detection circuit and the like.

According to a sixth exemplary embodiment, a voltage application circuit that applies a standard voltage to either electrode of the capacitor is included. The voltage application circuit is connected to a connection line that connects the output-side switch and the first differential voltage detection circuit, and has an application switch that switches between a state in which the standard voltage is applied to either electrode through the output-side switch and a state in which the standard voltage is not applied. The first differential voltage detection circuit outputs a fourth voltage when the output-side switch is in an open state and the application switch is in a closed state. The fault determining unit determines a fault in the voltage application circuit based on the fourth voltage and the standard voltage.

As a result of the above-described embodiment, when the voltage application circuit is normal, the fourth voltage is a voltage that is based on the standard voltage. Meanwhile, for example, when the voltage application circuit is faulty, such as by an open fault in the application switch, the fourth voltage becomes unstable and deviates from the standard voltage. Therefore, when the fourth voltage is not the voltage that is based on the standard voltage, a determination can be made that the voltage application circuit is faulty.

According to a seventh exemplary embodiment, the capacitor has a first capacitor and a second capacitor that are connected in series. A connection point that connects the first capacitor and the second capacitor is connected to an input terminal of the voltage output circuit to which the third reference voltage is supplied. A voltage application circuit that applies a standard voltage to the connection point is included. The voltage application circuit has an application switch that switches between a state in which the standard voltage is applied to the connection point and a state in which the standard voltage is not applied. The fault determining unit determines a fault in the voltage application circuit based on the third voltage and the standard voltage when the application switch is in a closed state.

As a result of the above-described configuration, when the voltage application circuit is normal, the third voltage is a voltage that is based on the standard voltage. Meanwhile, when the voltage application circuit is faulty, the third voltage becomes unstable and deviates from the standard voltage. Therefore, when the third voltage is not the voltage that is based on the standard voltage, a determination can be made that the voltage application circuit is faulty.

First Embodiment

A first embodiment actualizing a voltage detection apparatus of the present disclosure will hereinafter be described with reference to the drawings. For example, a voltage detection apparatus 20 of the present disclosure is applicable to a power supply system 100 that is mounted in a hybrid car or an electric car.

As shown in FIG. 1, the power supply system 100 according to the present embodiment includes an assembled battery 10 and the flying-capacitor-type voltage detection apparatus 20.

The assembled battery 10 serves as a power supply source for an onboard electrical load including a rotating electric machine for traveling (not shown) of a vehicle. The assembled battery 10 includes a series-connection body of battery cells that serve as unit batteries. For example, an inter-terminal voltage is several hundred V. For example, as the battery cell, a storage battery such as a lithium-ion battery or a nickel-hydrogen storage battery can be used.

According to the present embodiment, a plurality of detection blocks A are configured by the battery cells that configure the assembled battery 10 being divided to include at least a single battery cell among the battery cells. The assembled battery 10 has a series-connection body of the plurality of detection blocks A. According to the present embodiment, for convenience of description, the assembled battery 10 includes six detection blocks A.

Hereafter, according to the present embodiment, the detection blocks A that configure the assembled battery 10 are referred to as a sixth detection block A6, a fifth detection block A5, . . . , a first detection block A1 in order from the detection block A on a highest-potential side among the detection blocks A. The detection blocks A1 to A6 include the same number of battery cells as one another and have the same rated voltage as one another. For example, the rated voltage of the detection block A is 50 V (see FIG. 4).

The assembled battery 10 is provided with first to seventh electrode terminals T1 to T7. The number of electrode terminals T1 to T7 is greater than the number of detection blocks A1 to A6 by one. When m is an integer from 1 to 6, an m+1th electrode terminal Tm+1 is connected to a positive electrode terminal of an mth detection block Am. In addition, an mth electrode terminal Tm is connected to a negative electrode terminal of the mth detection block Am.

The voltage detection apparatus 20 includes a resistance unit 21, an input-side switch unit 22, a capacitor unit 23, an output-side switch unit 24, a detecting unit 25, a reference voltage supplying unit 26, and a control unit 27. Here, according to the present embodiment, the control unit 27 corresponds to a fault determining unit.

The resistance unit 21 is provided between the assembled battery 10 and the input-side switch unit 22. When n is an integer from 1 to 7, the resistance unit 21 includes a plurality of current limiting resistances RL that are individually provided on detection lines Ln that are connected to the electrode terminals Tn. The current limiting resistances RL are provided to prevent an inrush current from flowing from the assembled battery 10 (high-voltage side) to the input-side switch unit 22 (low-voltage side), and have the same resistance value as one another.

The input-side switch unit 22 is provided between the resistance unit 21 and the capacitor unit 23. The input-side switch unit 22 includes first to seventh switches SW1 to SW7 that are individually connected to the detection lines Ln. The switch SWn of the input-side switch unit 22 (referred to, hereafter, as simply a switch SWn) opens and closes between the electrode terminal Tn and the capacitor unit 23. For example, a pair of N-channel metal-oxide-semiconductor field-effect transistors (MOSFETs) of which sources are connected to each other, a photorelay, a relay, or the like can be used as the switch SWn.

The capacitor unit 23 has a single capacitor CA. That is, the voltage detection apparatus 20 is a single-flying-capacitor-type voltage detection apparatus. The capacitor CA is provided with first and second terminals N1 and N2 as connection terminals. The electrode terminals Tn of the assembled battery 10 are connected to either of the terminals N1 and N2 through the switches SWn.

Specifically, the first, third, fifth, and seventh electrode terminals T1, T3, T5, and T7, among the first to seventh electrode terminals T1 to T7, are connected to the first terminal N1. The second, fourth, and sixth electrode terminals T2, T4, and T6 are connected to the second terminal N2. That is, the switches SW1 to SW7 connect the detection blocks A1 to A6 to the capacitor CA in parallel, and open and close between the detection blocks A1 to A6 and the capacitor CA.

The output-side switch unit 24 is provided between the capacitor unit 23 and the detecting unit 25. The output-side switch unit 24 includes switches SWA and SWB that are each connected to either of the first and second terminals N1 and N2 of the capacitor CA. Specifically, the switch SWA is connected to the first terminal N1 and the switch SWB is connected to the second terminal N2. The switches SWA and SWB open and close between the capacitor CA and the detecting unit 25. For example, semiconductor switches such as N-channel MOSFETs can be used as the switches SWA and SWB.

The detecting unit 25 is provided between the output-side switch unit 24 and the control unit 27. The detecting unit 25 has a first differential voltage detection circuit 25A and a second differential voltage detection circuit 25B. The first differential voltage detection circuit 25A and the second differential voltage detection circuit 25B are connected to the capacitor CA in parallel, and detect a voltage of the capacitor CA. Based on the voltage of the capacitor CA, the differential voltage detection circuits 25A and 25B detect voltages V1 to V6 of the detection blocks A1 to A6 that are used to charge the capacitor CA.

The differential voltage detection circuits 25A and 25B are differential amplification circuits. Specifically, the first differential voltage detection circuit 25A includes a first operational amplifier 28 and first to fourth resistors R1 to R4.

A negative-electrode-side input terminal 28A of the first operational amplifier 28 is connected to the first terminal N1 of the capacitor CA with the first resistor R1 therebetween, and connected to an output terminal 28C of the first operational amplifier 28 with the third resistor R3 therebetween. A positive-electrode-side input terminal 28B of the first operational amplifier 28 is connected to the second terminal N2 of the capacitor CA with the second resistor R2 therebetween, and connected to a first output terminal 26A of the reference voltage supplying unit 26 with the fourth resistor R4 therebetween.

Here, according to the present embodiment, the electrode on the first terminal N1 side and the electrode on the second terminal N2 side correspond to a first electrode and a second electrode.

The first differential voltage detection circuit 25A amplifies the voltage of the capacitor CA by a predetermined first amplification factor. Specifically, the first differential voltage detection circuit 25A amplifies the voltage of the capacitor CA to a first differential voltage VA that is within a predetermined first output range Z1 that is set within a voltage range from 0 V to 5 V (see FIG. 4).

The first differential voltage VA changes within the first output range Z1 based on changes in the voltage of the capacitor CA. The output terminal 28C is connected to a first input terminal 27A of the control unit 27. The first differential voltage detection circuit 25A outputs the first differential voltage VA to the first input terminal 27A of the control unit 27. Here, according to the present embodiment, the first differential voltage VA corresponds to a first voltage.

The second differential voltage detection circuit 25B includes a second operational amplifier 29 and fifth to eighth resistors R5 to R8.

A negative-electrode-side input terminal 29A of the second operational amplifier 29 is connected to the first terminal N1 of the capacitor CA with the fifth resistor R5 therebetween, and connected to an output terminal 29C of the second operational amplifier 29 with the resistor R7 therebetween. A positive-electrode-side input terminal 29B of the second operational amplifier 29 is connected to the second terminal N2 of the capacitor CA with the sixth resistor R6 therebetween, and connected to a second output terminal 26B of the reference voltage supplying unit 26 with the eighth resistor R8 therebetween.

The output-side switch unit 24 connects the first terminal N1 of the capacitor CA to the negative-electrode-side input terminals 28A and 29A of the first and second operational amplifiers 28 and 29, and the second terminal N2 of the capacitor CA to the positive-electrode-side input terminals 28B and 29B of the first and second operational amplifiers 28 and 29.

The second differential voltage detection circuit 25B amplifies the voltage of the capacitor CA by a predetermined second amplification factor. Specifically, the second differential voltage detection circuit 25B amplifies the voltage of the capacitor CA to a second differential voltage VB that is within a predetermined second output range Z2 that is set within a voltage range from 0 V to 5 V (see FIG. 4). The second differential voltage VB changes within the second output range Z2 based on changes in the voltage of the capacitor CA. The output terminal 29C is connected to a second input terminal 27B of the control unit 27. The second differential voltage detection circuit 25B outputs the second differential voltage VB to the second input terminal 27B of the control unit 27. Here, according to the present embodiment, the second differential voltage VB corresponds to a second voltage. In addition, according to the present embodiment, the second amplification factor is equal to the first amplification factor.

In addition, the detecting unit 25 has a voltage follower circuit 25C. The voltage follower circuit 25C includes a third operational amplifier 30, and ninth and tenth resistor R9 and R10. A negative-electrode-side input terminal 30A of the third operational amplifier 30 is connected to an output terminal 30C of the third operational amplifier 30 with the ninth resistor R9 therebetween. A positive-electrode-side input terminal 30B of the third operational amplifier 30 is connected to a third output terminal 26C of the reference voltage supplying unit 26 with the tenth resistor R10 therebetween.

In the detecting unit 25, as a result of the operational amplifiers 28 to 30 being used in the circuits 25A to 25C, in the reference voltage supplying unit 26, impedances at the first to third output terminals 26A to 26C are substantially equal. In the first to third operational amplifiers 28 to 30, impedances at the output terminals 28C to 30C are substantially equal. Here, according to the present embodiment, the voltage follower circuit 25C corresponds to a voltage output circuit.

The output terminal 30C is connected to a third input terminal 27C of the control unit 27. The voltage follower circuit 25C outputs a voltage that is inputted to the positive-electrode-side input terminal 30B to the third input terminal 27C of the control unit 27 as is and performs impedance conversion.

The reference voltage supplying unit 26 supplies first to third reference voltages REF1 to REF3 to the circuits 25A to 25C. The reference voltage supplying unit 26 has the first to third output terminals 26A to 26C. In the reference voltage supplying unit 26, the third output terminal 26C is arranged between the first output terminal 26A and the second output terminal 26B. The first reference voltage REF1 is supplied from the first output terminal 26A, among the output terminals 26A to 26C, to the first operational amplifier 28.

In addition, the reference voltage supplying unit 26 supplies the second reference voltage REF2 from the second output terminal 26B to the second operational amplifier 29. Furthermore, the third reference voltage REF3 is supplied from the third output terminal 26C to the third operational amplifier 30. As a result, the voltage follower circuit 25C outputs an output voltage VC that is equal to the third reference voltage REF3 to the third input terminal 27C of the control unit 27. Here, according to the present embodiment, the output voltage VC corresponds to a third voltage.

According to the present embodiment, the third reference voltage REF3 is set to a voltage that differs from the first and second reference voltages REF1 and REF2. In addition, the third reference voltage REF3 is set to a voltage that is outside the first and second output ranges Z1 and Z2. Therefore, the output voltage VC is set to a voltage that differs from the first and second differential voltages VA and VB.

The control unit 27 is a microcomputer that is configured by a central processing unit (CPU), a memory, and the like. The control unit 27 controls opening/closing of the switches SWn, opening/closing of the switches SWA and SWB, and voltage values of the reference voltages that are supplied from the reference voltage supplying unit 26. In addition, the control unit includes the first to third input terminals 27A to 27C. In the control unit 27, the third input terminal 27C is arranged between the first input terminal 27A and the second input terminal 27B. The first differential voltage VA is inputted to the first input terminal 27A, among the input terminals 27A to 27C. The second differential voltage VB is inputted to the second input terminal 27B. In addition, the output voltage VC is inputted to the third input terminal 27C.

The control unit 27 performs a fault determination process that includes a charging process in which the capacitor CA is charged using the detection blocks A1 to A6 of the assembled battery 10 in a state in which the capacitor CA and the detecting unit 25 are electrically insulated, an acquisition process in which the first and second differential voltages VA and VB are acquired in a state in which the assembled battery 10 and the capacitor CA are electrically insulated, and a determination process in which a fault in the first differential voltage detection circuit 25A or the second differential voltage detection circuit 25B is determined based on the acquired first and second differential voltages VA and VB.

Figure 2:
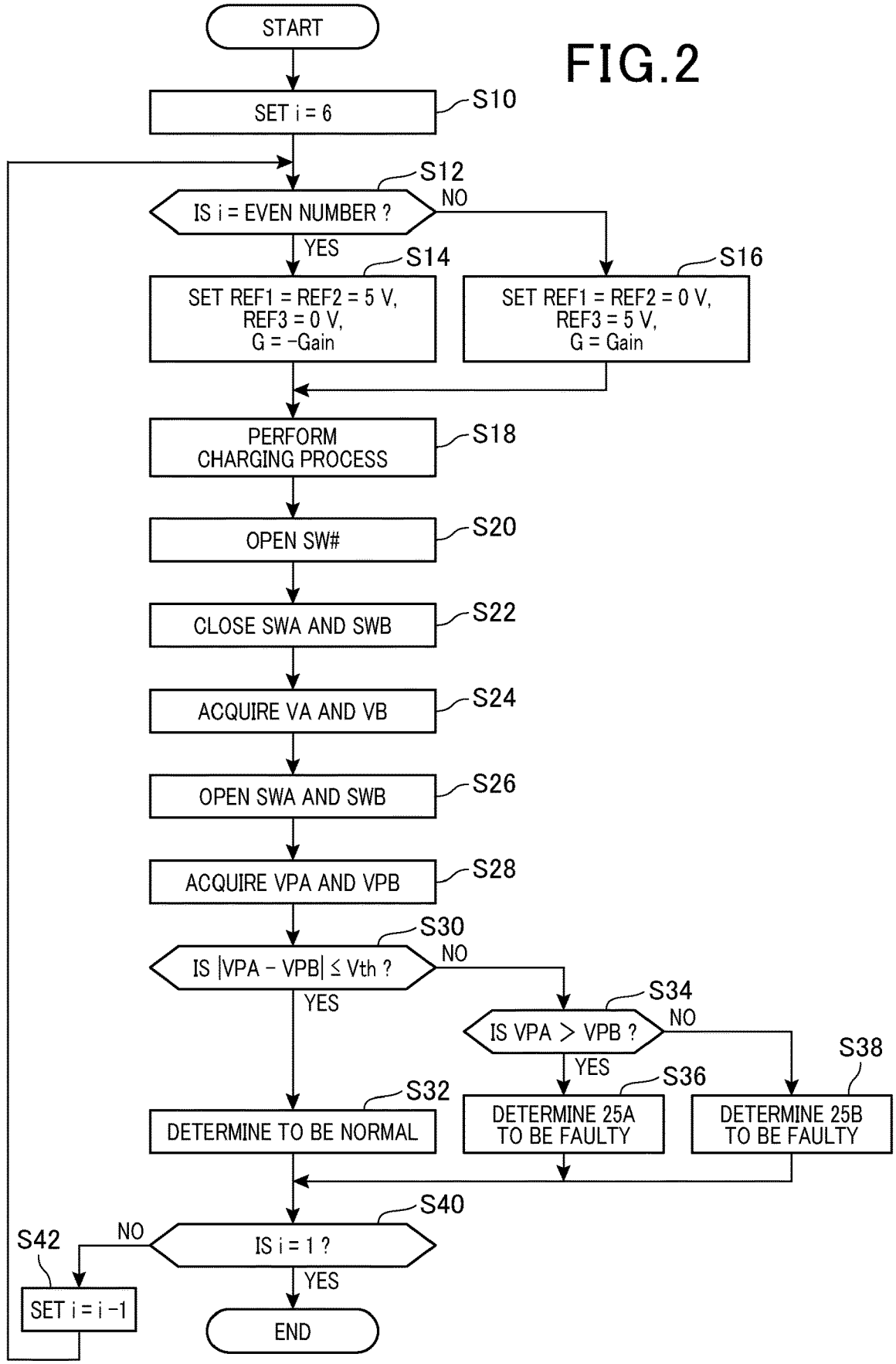
FIG. 2 is a flowchart of the steps in a fault determination process according to the first embodiment.

Next, the fault determination process according to the present embodiment will be described with reference to FIG. 2. Here, FIG. 2 is a flowchart of the steps in the above-described process. For example, the process is repeatedly performed at a predetermined cycle by the control unit 27. Here, at start of the fault determination process, the switches SWn and the switches SWA and SWB are switched to an open state.

In this series of processes, first, at step S10, a variable i that specifies the detection block A to serve as a target is set to 6. At subsequent step S12, whether the variable i is an even number is determined.

When the target detection block A is the second, fourth, or sixth detection block A2, A4, or A6, an affirmative determination is made at step S12. In this case, at step S14, the first and second reference voltages REF1 and REF2 are set to 5 V, and the third reference voltage REF3 is set to 0 V. That is, the first and second reference voltages REF1 and REF2 are set to voltages on an upper-limit side of the output ranges Z1 and Z2. The third reference voltage REF3 is set to a voltage on a lower-limit side of the output ranges Z1 and Z2. In addition, a gain G that indicates the amplification factors of the first and second differential voltage detection circuits 25A and 25B is set to −Gain that is a negative value. Here, Gain is a value that is obtained by the voltage range of each of the output ranges Z1 and Z2 being divided by the rated voltage of the detection block A and is, for example, 0.1.

Meanwhile, when the target detection block A is the first, third, or fifth detection block A1, A3, or A5, a negative determination is made at step S14. In this case, at step S16, the first and second reference voltages REF1 and REF2 are set to 0 V, and the third reference voltage REF3 is set to 5 V. That is, the first and second reference voltages REF1 and REF2 are set to voltages on the lower-limit side of the output ranges Z1 and Z2. The third reference voltage REF3 is set to a voltage on the upper-limit-side of the output ranges Z1 and Z2. In addition, the gain G is set to Gain that is a positive value.

After completion of step S14 or S16, at step S18, the charging process is performed. Specifically, a switch (referred to, hereafter, as a target switch) SW # that is connected to the target detection block A, among the first to seventh switches SW1 to SW7, is switched to a closed state. The capacitor CA is charged using the target detection block A. For example, when the capacitor CA is charged with electric charge of the sixth detection block A6, the switches SW6 and SW7 are switched to the closed state.

When an affirmative determination is made at step S12, the capacitor CA is charged such that the voltage at the first terminal N1 of the capacitor CA is higher than the voltage at the second terminal N2 by the detection block A and the capacitor CA being connected. As a result, a polarity of the voltage of the capacitor CA becomes a negative polarity. The first and second differential voltages VA and VB, and the voltage of the detection block A have a negative correlation.

Figure 4:
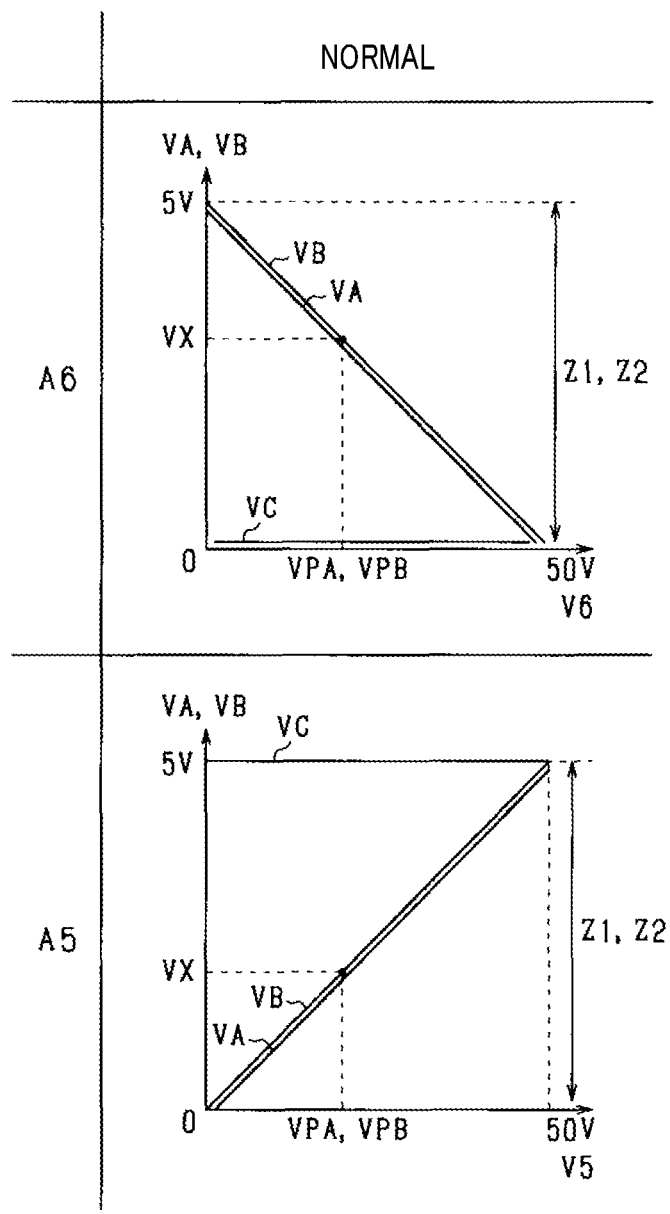
FIG. 4 is a diagram of specific correlations when first and second differential voltage detection circuits are both normal.

Should the setting at step S14 be performed when the first and second differential voltages VA and VB, and the voltage of the detection block A have a negative correlation, the first and second differential voltages VA and VB are amplified to 0 V when the voltage of the detection block A is 50 V, and the first and second differential voltages VA and VB are amplified to 5 V when the voltage at the detection block A is 0 V (see FIG. 4).

Meanwhile, when a negative determination is made at step S12, the capacitor CA is charged such that the voltage at the first terminal N1 of the capacitor CA is lower than the voltage at the second terminal N2 by the detection block A and the capacitor CA being connected. As a result, the polarity of the voltage of the capacitor CA becomes a positive polarity. The first and second differential voltages VA and VB, and the voltage of the detection block A have a positive correlation.

Should the setting at step S16 be performed when the first and second differential voltages VA and VB, and the voltage of the detection block A have a positive correlation, the first and second differential voltages VA and VB are amplified to 5 V when the voltage of the detection block A is 50 V, and the first and second differential voltages VA and VB are amplified to 0 V when the voltage at the detection block A is 0 V (see FIG. 4).

After a predetermined charging period, at step S20, the target switch SW # is switched to the open state. When the target switch SW # is switched to the open state, the acquisition process is performed. Specifically, at step S22, the switches SWA and SWB are switched to the closed state. At subsequent step S24, the first and second differential voltages VA and VB are acquired. Here, the output voltage VC is not acquired.

In the fault determination process according to the present embodiment, as a result of the output voltage VC not being acquired, processing load on the control unit 27 is reduced, and decrease in failure determination speed is suppressed. After acquisition of the first and second differential voltages VA and VB, at step S26, the switches SWA and SWB are switched to the open state.

When the switches SWA and SWB are switched to the open state, the determination process is performed. Specifically, at step S28, a first capacitor voltage VPA that is the voltage of the capacitor CA is calculated using the first differential voltage VA acquired at step S24. In addition, a second capacitor voltage VPB that is the voltage of the capacitor CA is calculated using the second differential voltage VB acquired at step S24. The first capacitor voltage VPA is expressed such as by a following (expression 1) using the gain G. The second capacitor voltage VPB is expressed such as by a following (expression 2) using the gain G.

$$VPA=(VA-REF1)/G \quad \text{(expression 1)}$$

$$VPB=(VB-REF2)/G \quad \text{(expression 2)}$$

At subsequent step S30, an absolute value of a difference between the first capacitor voltage VPA and the second capacitor voltage VPB calculated at step S28 is calculated. Whether the absolute value is less than a determination threshold Vth is determined. Here, for example, the determination threshold Vth is set in advance to a maximum value of the above-described absolute value that may be generated by a voltage acquisition error in the control unit 27.

When an affirmative determination is made at step S30, at step S32, whether the first and second differential voltage detection circuits 25A and 25B are both normal is determined.

Meanwhile, when a negative determination is made at step S30, at step S34, whether the first capacitor voltage VPA is greater than the second capacitor voltage VPB is determined. When an affirmative determination is made at step S34, at step S36, the first differential voltage detection circuit 25A is determined to be faulty. Meanwhile, when a negative determination is made at step S34, at step S38, the second differential voltage detection circuit 25B is determined to be faulty.

According to the present embodiment, a fault in the first differential voltage detection circuit 25A includes a short-circuit fault between the first differential voltage detection circuit 25A and the voltage follower circuit 25C. This short-circuit fault includes a short-circuit fault between the first output terminal 26A and the third output terminal 26C in the reference voltage supplying unit 26 (referred to, hereafter, as a REF1-REF3 short-circuit fault), and a short-circuit fault between the first input terminal 27A and the third input terminal 27C in the control circuit 27 (referred to, hereafter, as a VA-VC short-circuit fault).

Here, the REF1-REF3 short-circuit fault and the VA-VC short-circuit fault include a short circuit between connection lines that are connected to the terminals. This similarly applies to a fault in the second differential voltage detection circuit 25B.

At subsequent step S40, whether the variable i is 1 is determined. When a negative determination is made at step S40, at step S42, the control unit 27 subtracts 1 from the variable i and returns to step S12. Meanwhile, when an affirmative determination is made at step S40, the control unit 27 ends the fault determination process.

Figure 3:
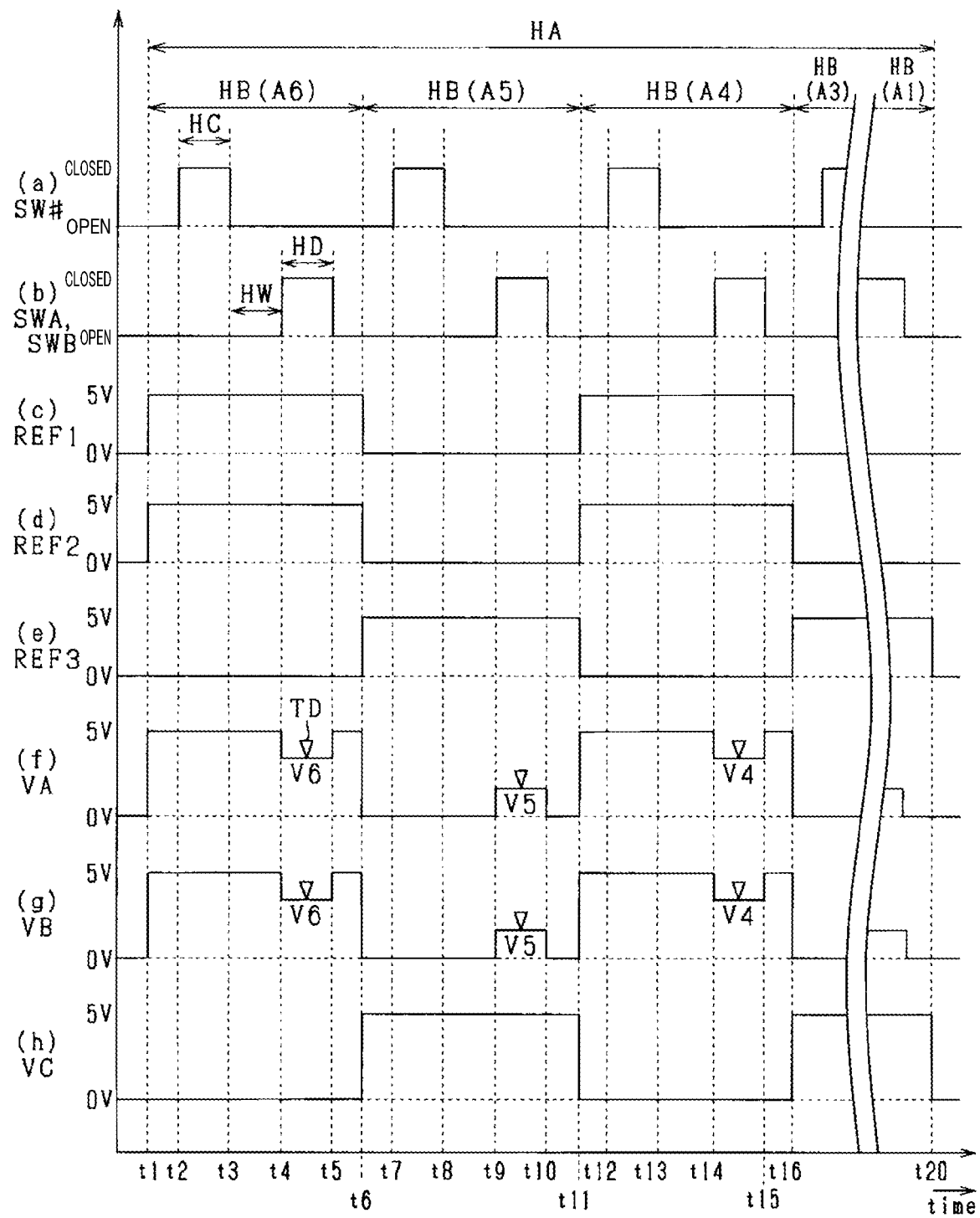
FIG. 3 is a timing chart of an example of the fault determination process.

Next, FIG. 3 shows an example of the fault determination process. FIG. 3 shows: by (a), transitions in the open/closed state of the target switch SW #; by (b), transitions in the open/closed state of the switches SWA and SWB; by (c) to (e), transitions in the first to third reference voltages REF1 to REF3; by (f) and (g), transitions in the first and second differential voltages VA and VB; and, by (h), transitions in the output voltage VC.

In the example shown in FIG. 3, when the fault determination process targeting the sixth detection block A6 is started at time t1, as shown in FIG. 3 by (c) to (e), the first and second reference voltages REF1 and REF2 are set to 5 V, and the third reference voltage REF3 is set to 0 V. As a result, as shown in FIG. 3 by (f) to (h), the first and second differential voltages VA and VB increase to maximum voltages of the output ranges Z1 and Z2, and the output voltage VC is held at 0 V.

At subsequent time t2, the sixth and seventh switches SW6 and SW7 that are the target switches SW # are switched to the closed state. As a result, the capacitor CA is charged by the sixth detection block A6 over a charging period HC.

Upon elapse of the charging period HC, at time t3, the sixth and seventh switches SW6 and SW7 are switched to the open state. Upon elapse of a predetermined wait period HW from time t3, at time t4, the switches SWA and SWB are switched to the closed state. As a result, the first and second differential voltages VA and VB become voltages that are based on the voltage of the capacitor CA. At a predetermined detection timing TD during an acquisition period HD from time t3, the first and second differential voltages VA and VB are acquired.

Upon elapse of the acquisition period HD, at time t5, the switches SWA and SWB are switched to the open state. At subsequent time t6, the fault determination process targeting the sixth detection block A6 is ended, and a fault determination process targeting the fifth detection block A5 is started next. That is, a period HB(A6) from time t1 to time t6 is the determination period targeting the sixth detection block A6.

When the fault determination process targeting the fifth detection block A5 is started at time t6, as shown in FIG. 3 by (c) to (e), the first and second reference voltages REF1 and REF2 are set to 0 V, and the third reference voltage REF3 is set to 5 V. As a result, as shown in FIG. 3 by (f) to (h), the first and second differential voltages VA and VB decrease to 0 V and the output voltage increases to 5 V.

Here, the fault determination process targeting the fifth detection block A5 is substantially identical compared to the fault determination process targeting the sixth detection block A6, excluding the settings of the first to third reference voltages REF1 to REF3, described above. Redundant descriptions are omitted.

After the end of the fault determination process targeting the fifth detection block A5, the fault determination processes targeting the fourth detection block A4, the third detection block A3, . . . , the first detection block A1 are successively performed. Therefore, a period HA that is obtained by the determination periods HB of the detection blocks A being added is a period required for the fault determination process of all detection blocks.

FIG. 4 shows a correlation (referred to, hereafter, as a specific correlation) between the voltage of the capacitor CA, and the first and second differential voltages VA and VB when the first and second differential voltage detection circuits 25A and 25B are both normal. The specific correlation is switched between a positive correlation and a negative correlation based on the detection block A that charges the capacitor CA. Therefore, in FIG. 4, the negative correlation will be described using the sixth detection block A6, and the positive correlation will be described using the fifth detection block A5. Here, FIG. 4 also shows the output voltage VC.

According to the present embodiment, the specific correlation of the first differential voltage VA and the specific correlation of the second differential voltage VB are equal. As shown in FIG. 4, when the capacitor CA is charged by the sixth detection block A6, the first and second differential voltages VA and VB decrease as the voltage V6 of the sixth detection block A6 increases. In addition, when the capacitor CA is charged by the fifth detection block A5, the first and second differential voltages VA and VB increase as the voltage V5 of the fifth detection block A5 increases.

In both cases, the first and second differential voltages VA and VB are linearly proportional to the voltage of the detection block A. The voltage of the detection block A when the first and second differential voltages VA and VB are VX is the first and second capacitor voltages VPA and VPB. In addition, in both cases, a voltage difference between the first and second differential voltages VA and VB and the output voltage VC decreases as the voltage of the detection block A increases.

Figure 5:
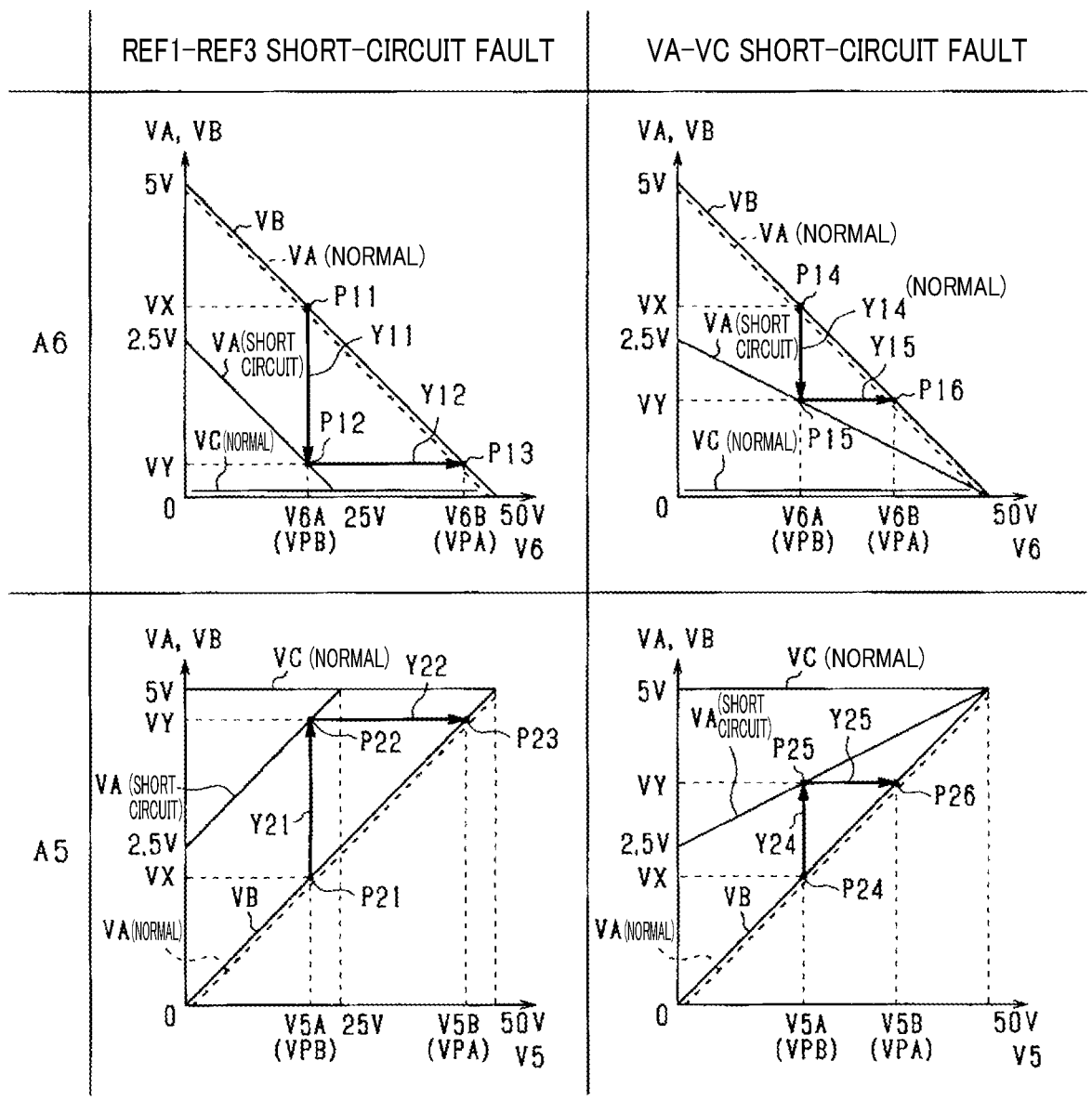
FIG. 5 is a diagram of specific correlations when the first differential voltage detection circuit is faulty.

Meanwhile, FIG. 5 shows the specific correlation when the first differential voltage detection circuit 25A is faulty. FIG. 5 shows the specific correlation when the REF1-REF3 short-circuit fault or the VA-VC short-circuit fault has occurred. Here, in FIG. 5, the specific correlation when the first differential voltage detection circuit 25A is normal is shown by a broken line. The output voltage VC is shown by a solid line.

First, regarding the REF1-REF3 short-circuit fault, a case in which the capacitor CA is charged by the sixth detection block A6 will be described. As shown in FIG. 5, when the REF1-REF3 short-circuit fault occurs, because the impedances at the first and third output terminals 26A and 26C are substantially equal, the specific correlation of the first differential voltage VA changes in a following manner. Specifically, when the voltage V6 of the sixth detection block A6 is 0 V, the first differential voltage VA is 2.5 V rather than 5 V.

In addition, a relationship of a decrease amount of the first differential voltage VA to an increase amount of the voltage V6 (that is, a slope of the first differential voltage VA) does not change before and after the occurrence of the REF1-REF3 short-circuit fault. Here, when the voltage V6 is within a range from 25 V to 50 V, a positive single power supply is assumed as a power supply of an input circuit of the control unit 27. Therefore, the first differential voltage VA is 0 V regardless of the voltage V6. A characteristic in that a short circuit between terminals of which the impedances are substantially equal is a value that is close to a center thereof is used not only in the above-described operation but also in the description below.

When the actual voltage V6 of the sixth detection block A6 is V6A, as indicated by a point P11, the second differential voltage VB that corresponds to the second differential voltage detection circuit 25B that is normal is assumed to be VX. At this time, when the REF1-REF3 short-circuit fault occurs, the specific correlation of the first differential voltage VA changes as indicated by an arrow Y11. The first differential voltage VA that corresponds to the first differential voltage detection circuit 25A in which a fault has occurred decreases from VX to VY as indicated by a point P12.

The control unit 27 stores therein the specific correlation of the first differential voltage VA when the first differential voltage detection circuit 25A is normal, as shown by the broken line in FIG. 5. Therefore, when the REF1-REF3 short-circuit fault occurs, regardless of the voltage V6 of the sixth detection block A6 being V6A, the first capacitor voltage VPA that indicates the voltage V6 of the sixth detection block A6 is calculated as V6B that is greater than V6A, as indicated by a point P13. That is, in accompaniment with changes in the specific correlation of the first differential voltage VA, the first capacitor voltage VPA changes from the second capacitor voltage VPB to a voltage that is greater than the second capacitor voltage VPB, as indicated by an arrow Y12.

Next, a case in which the capacitor CA is charged by the fifth detection block A5 will be described. When the REF1-REF3 short-circuit fault occurs, when the voltage V5 of the fifth detection block A5 is 0 V, the first differential voltage VA is 2.5 V rather than 0 V. In addition, the slope of the first differential voltage VA does not change before and after the occurrence of the REF1-REF3 short-circuit fault. Here, the first differential voltage VA is 5 V regardless of the voltage V5 when the voltage V5 is within a range from 25 V to 50 V.

When the actual voltage V5 of the fifth detection block A5 is VSA, as indicated by a point P21, the second differential voltage VB is assumed to be VX. At this time, when the REF1-REF3 short-circuit fault occurs, the specific correlation of the first differential voltage VA changes as indicated by an arrow Y21. The first differential voltage VA that corresponds to the first differential voltage detection circuit 25A in which a fault has occurred increases from VX to VY as indicated by a point P22.

The control unit 27 stores therein the specific correlation of the first differential voltage VA when the first differential voltage detection circuit 25A is normal, as shown by the broken line in FIG. 5. Therefore, when the REF1-REF3 short-circuit fault occurs, regardless of the voltage V5 of the fifth detection block A5 being V5A, the first capacitor voltage VPA that indicates the voltage V5 of the fifth detection block A5 is calculated as V5B that is greater than V5A, as indicated by a point P23. That is, in accompaniment with changes in the specific correlation of the first differential voltage VA, the first capacitor voltage VPA changes from the second capacitor voltage VPB to a voltage that is greater than the second capacitor voltage VPB, as indicated by an arrow Y22.

Regarding the VA-VC short-circuit fault, a case in which the capacitor CA is charged by the sixth detection block A6 will be described.

When the VA-VC short-circuit fault occurs, because the impedances at the output terminals 28C and 30C of the first and third operational amplifiers 28 and 30 are substantially equal, the specific correlation of the first differential voltage VA changes in a following manner. Specifically, when the voltage V6 of the sixth detection block A6 is 0 V, the first differential voltage VA is 2.5 V rather than 5 V. In addition, when the VA-VC short-circuit fault occurs, the slope of the first differential voltage VA is ½ compared to that when the short-circuit fault has not occurred.

When the actual voltage V6 of the sixth detection block A6 is V6A, as indicated by a point P14, the second differential voltage VB is assumed to be VX. At this time, when the VA-VC short-circuit fault occurs, the specific correlation of the first differential voltage VA changes as indicated by an arrow Y14. The first differential voltage VA that corresponds to the first differential voltage detection circuit 25A in which a fault has occurred decreases from VX to VY as indicated by a point P15.

As a result, regardless of the voltage V6 of the sixth detection block A6 being V6A, the first capacitor voltage VPA that indicates the voltage V6 of the sixth detection block A6 is calculated as V6B that is greater than V6A, as indicated by a point P16. That is, in accompaniment with changes in the specific correlation of the first differential voltage VA, the first capacitor voltage VPA changes from the second capacitor voltage VPB to a voltage that is greater than the second capacitor voltage VPB, as indicated by an arrow Y15.

Next, a case in which the capacitor CA is charged by the fifth detection block A5 will be described. When the VA-VC short-circuit fault occurs, when the voltage V5 of the fifth detection block A5 is 0 V, the first differential voltage VA is 2.5 V rather than 0 V. In addition, when the VA-VC short-circuit fault occurs, the slope of the first differential voltage VA is ½ compared to that when the short-circuit fault has not occurred.

When the actual voltage V5 of the fifth voltage block A5 is V5A, as indicated by a point P24, the second differential voltage VB is assumed to be VX. At this time, when the VA-VC short-circuit fault occurs, the specific correlation at the first differential voltage VA changes as indicated by an arrow Y24. The first differential voltage VA that corresponds to the first differential voltage detection circuit 25A in which a fault has occurred increases from VX to VY as indicated by a point P25.

As a result, regardless of the voltage V5 of the fifth detection block A5 being VSA, the first capacitor voltage VPA that indicates the voltage V5 of the fifth detection block A5 is calculated as V5B that is greater than VSA, as indicated by a point P26. That is, in accompaniment with changes in the specific correlation of the first differential voltage VA, the first capacitor voltage VPA changes from the second capacitor voltage VPB to a voltage that is greater than the second capacitor voltage VPB, as indicated by an arrow Y25.

That is, when the first differential voltage detection circuit 25A is faulty, the first capacitor voltage VPA is a voltage that is greater than the second capacitor voltage VPB regardless of the detection block A that charges the capacitor CA. In addition, when the second differential voltage detection circuit 25B is faulty, the second capacitor voltage VPB is a voltage that is greater than the first capacitor voltage VPA regardless of the detection block A that charges the capacitor CA.

In this manner, in the voltage detection apparatus 20 according to the present embodiment, when the first differential voltage detection circuit 25A or the second differential voltage detection circuit 25B is faulty, a voltage difference occurs between the first differential voltage VA and the second differential voltage VB. Therefore, a determination can be made that the first differential voltage detection circuit 25A or the second differential voltage detection circuit 25B is faulty when this voltage difference occurs.

In particular, when the first differential voltage detection circuit 25A is faulty, the first capacitor voltage VPA changes to a voltage that is greater than the second capacitor voltage VPB. When the second differential voltage detection circuit 25B is faulty, the second capacitor voltage VPB changes to a voltage that is greater than the first capacitor voltage VPA. Therefore, which of the differential voltage detection circuits 25A and 25B is faulty can be determined using a magnitude relationship between the first capacitor voltage VPA and the second capacitor voltage VPB.

Figure 6:
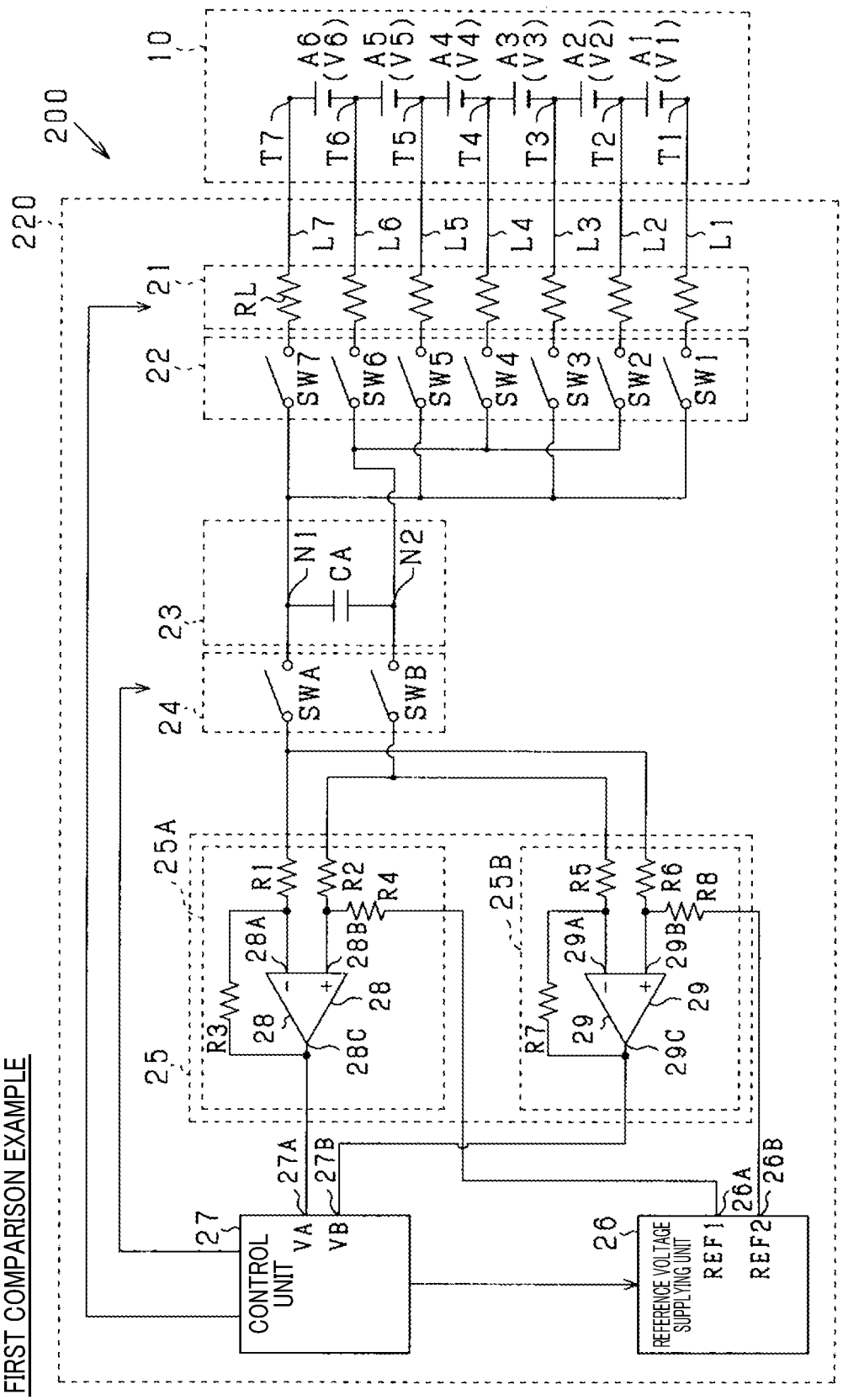
FIG. 6 is a diagram of a power supply system of a first comparative example.

FIG. 6 shows a power supply system 200 of a first comparative example. The power supply system 200 includes a single-flying-capacitor-type voltage detection apparatus 220. The voltage detection apparatus 220 differs from the voltage detection apparatus 20 according to the present embodiment in that the voltage follower circuit 25C is not provided.

In addition, the voltage detection apparatus 220 differs in that, in the second differential voltage detection circuit 25B, the negative-electrode-side input terminal 29A is connected to the second terminal N2 of the capacitor CA by the switch SWB and the positive-electrode-side input terminal 29B is connected to the first terminal N1 of the capacitor CA by the switch SWA. That is, the first and second differential voltage detection circuits 25A and 25B are connected to the capacitor CA such as to operate with opposite polarities.

Furthermore, the voltage detection apparatus 220 differs in that, in the reference voltage supplying unit 26, the first output terminal 26A and the second output terminal 26B are closely arranged. In the control unit 27, the first input terminal 27A and the second input terminal 27B are closely arranged.

Figure 7:
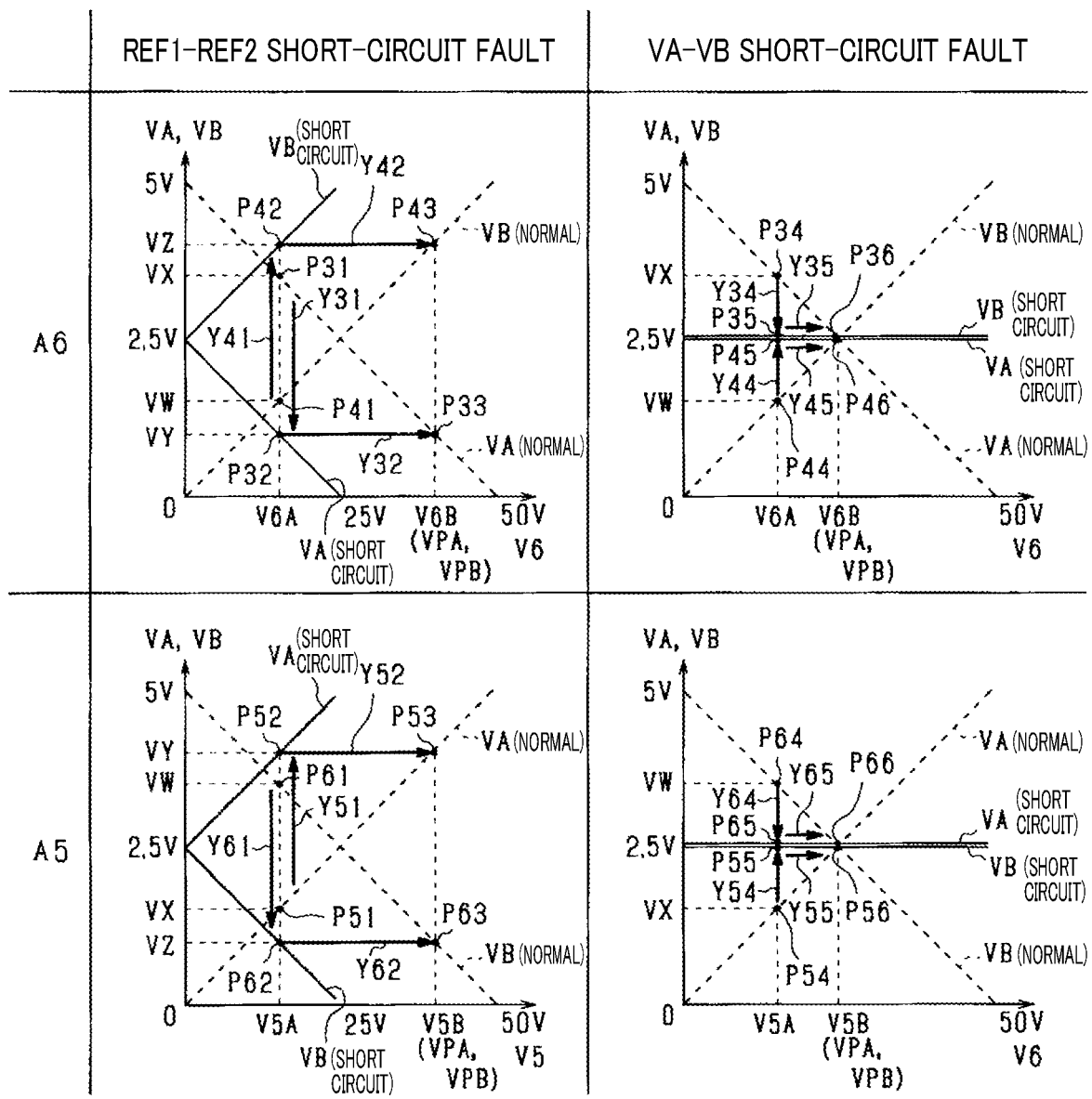
FIG. 7 is a diagram of specific correlations in the first comparative example.

FIG. 7 shows a specific correlation when the first differential voltage detection circuit 25A is faulty in the first comparative example. A fault in the first differential voltage detection circuit 25A includes a short-circuit fault between the first differential voltage detection circuit 25A and the second differential voltage detection circuit 25B. This short-circuit fault includes a short-circuit fault between the first output terminal 26A and the second output terminal 26B in the reference voltage supplying unit 26 (referred to, hereafter, as a REF1-REF2 short-circuit fault), and a short-circuit fault between the first input terminal 27A and the second input terminal 27B in the control unit 27 (referred to, hereafter, as a VA-VB short-circuit fault). FIG. 7 shows a specific correlation when the REF1-REF2 short-circuit fault or the VA-VB short-circuit fault occurs.

As shown by a broken line in FIG. 7, the specific correlations of the first and second differential voltages VA and VB when the first and second differential voltage detection circuits 25A and 25B are both normal are that in which, when the capacitor CA is charged by the sixth detection block A6, the first differential voltage VA decreases and the second differential voltage VB increases as the voltage V6 of the sixth detection block A6 increases. In addition, when the capacitor CA is charged by the fifth detection block A5, the first differential voltage VA increases and the second differential voltage VB decreases as the voltage V5 of the fifth detection block A5 increases.

Next, regarding the REF1-REF2 short-circuit fault, a case in which the capacitor CA is charged by the sixth detection block A6 will be described.

As shown in FIG. 7, when the REF1-REF2 short-circuit fault occurs, because the impedances at the first and second output terminals 26A and 26B are substantially equal, the specific correlations of the first and second differential voltages VA and VB change in a following manner. Specifically, the specific correlation of the first differential voltage VA is such that, when the voltage V6 of the sixth detection block A6 is 0 V, the first differential voltage VA is 2.5 V rather than 5 V. In addition, the slope of the first differential voltage VA does not change before and after the occurrence of the REF1-REF2 short-circuit fault. Here, the first differential voltage VA is 0 V regardless of the voltage V6 when the voltage V6 is within a range from 25 V to 50 V.

When the actual voltage V6 of the sixth detection block A6 is V6A, as indicated by a point P31, the first differential voltage VA that corresponds to the first differential voltage detection circuit 25A that is normal is assumed to be VX. At this time, when the REF1-REF2 short-circuit fault occurs, the specific correlation of the first differential voltage VA changes as indicated by an arrow Y31. The first differential voltage VA that corresponds to the first differential voltage detection circuit 25A in which a fault has occurred decreases from VX to VY as indicated by a point P32.

As a result, regardless of the voltage V6 of the sixth detection block A6 being V6A, the first capacitor voltage VPA that indicates the voltage V6 of the sixth detection block A6 is calculated as V6B that is greater than V6A, as indicated by a point P33. That is, in accompaniment with changes in the specific correlation of the first differential voltage VA, the first capacitor voltage VPA changes from the second capacitor voltage VPB to a voltage that is greater than the second capacitor voltage VPB, as indicated by an arrow Y32.

In addition, the specific correlation of the second differential voltage VB is such that, when the voltage V6 of the sixth detection block A6 is 0 V, the second differential voltage VB is 2.5 V rather than 0 V. In addition, the slope of the second differential voltage VB does not change before and after the occurrence of the REF1-REF2 short-circuit fault. Here, the second differential voltage VB is 5 V regardless of the voltage V6 when the voltage V6 is within a range from 25 V to 50 V.

Therefore, when the actual voltage V6 of the sixth detection block A6 is V6A, as indicated by a point P41, the second differential voltage VB that corresponds to the second differential voltage detection circuit 25B that is normal is assumed to be VW. At this time, when the REF1-REF2 short-circuit fault occurs, the specific correlation of the second differential voltage VB changes as indicated by an arrow Y41. The second differential voltage VB that corresponds to the second differential voltage detection circuit 25B in which a fault has occurred decreases from VW to VZ as indicated by a point P42.

As a result, regardless of the voltage V6 of the sixth detection block A6 being V6A, the second capacitor voltage VPB that indicates the voltage V6 of the sixth detection block A6 is calculated as V6B that is greater than V6A, as indicated by a point P43. That is, in accompaniment with changes in the specific correlation of the second differential voltage VA, the second capacitor voltage VPB changes from the V6A to a voltage that is greater than V6A, as indicated by an arrow Y42.

Here, regarding the REF1-REF2 short-circuit fault, a description of a case in which the capacitor CA is charged by the fifth detection block A5 is substantially identical compared to the description of the case in which the capacitor CA is charged by the sixth detection block A6, other than the specific correlations of the first and second differential voltages VA and VB being opposite. Redundant descriptions are omitted.

That is, in the REF1-REF2 short-circuit fault, the first capacitor voltage VPA and the second capacitor voltage VPB both change to a voltage that is greater than V6A. In the voltage detection apparatus 220 of the first comparative example, in the REF1-REF2 short-circuit fault, the first capacitor voltage VPA and the second capacitor voltage VPB change to an equal voltage.

Next, regarding the VA-VB short-circuit fault, a case in which the capacitor CA is charged by the sixth detection block A6 will be described. When the VA-VB short-circuit fault occurs, because the impedances at the output terminals 28C and 29C of the first and second operational amplifiers 28 and 29 are substantially equal, the specific correlations of the first and second differential voltages VA and VB change in a following manner. Specifically, the specific correlation of the first differential voltage VA is that in which, when the capacitor CA is charged by the sixth detection block A6, the first differential voltage VA is 2.5 V regardless of the voltage V6 of the sixth detection block VA.

When the actual voltage V6 of the sixth detection block A6 is V6A, as indicated by a point P34, the first differential voltage VA that corresponds to the first differential voltage detection circuit 25A that is normal is assumed to be VX. At this time, when the VA-VB short-circuit fault occurs, the specific correlation of the first differential voltage VA changes as indicated by an arrow Y34. The first differential voltage VA that corresponds to the first differential voltage detection circuit 25A in which a fault has occurred decreases from VX to 2.5 V as indicated by a point P35.

As a result, regardless of the voltage V6 of the sixth detection block A6 being V6A, the first capacitor voltage VPA that indicates the voltage V6 of the sixth detection block A6 is calculated as V6B that is greater than V6A as indicated by a point P36. That is, in accompaniment with the changes in the specific correlation of the first differential voltage VA, the first capacitor voltage VPA changes from V6A to a voltage that is greater than V6A, as indicated by an arrow Y35.

In addition, the specific correlation of the second differential voltage VB is that in which, when the capacitor CA is charged by the sixth detection block A6, the second differential voltage VB is 2.5 V regardless of the voltage V6 of the sixth detection block A6.

Therefore, when the actual voltage V6 of the sixth detection block A6 is V6A, as indicated by a point P44, the second differential voltage VB that corresponds to the second differential voltage detection circuit 25B that is normal is assumed to be VW. At this time, when the VA-VB short-circuit fault occurs, the specific correlation of the second differential voltage VB changes as indicated by an arrow Y44. The second differential voltage VB that corresponds to the second differential voltage detection circuit 25B in which a fault has occurred increases from VW to 2.5 V as indicated by a point P45.

As a result, regardless of the voltage V6 of the sixth detection block A6 being V6A, the second capacitor voltage VPB that indicates the voltage V6 of the sixth detection block A6 is calculated as V6B that is greater than V6A as indicated by a point P36. That is, in accompaniment with the changes in the specific correlation of the second differential voltage VB, the second capacitor voltage VPB changes from V6A to a voltage that is greater than V6A, as indicated by an arrow Y45.

Here, regarding the VA-VB short-circuit fault, a description of a case in which the capacitor CA is charged by the fifth detection block A5 is substantially identical compared to the description of the case in which the capacitor CA is charged by the sixth detection block A6, other than the specific correlations of the first and second differential voltages VA and VB being opposite. Redundant descriptions are omitted.

That is, in the VA-VB short-circuit fault, the first capacitor voltage VPA and the second capacitor voltage VPB both change to a voltage that is greater than V6A. In the voltage detection apparatus 220 of the first comparative example, in the VA-VB short-circuit fault, the first capacitor voltage VPA and the second capacitor voltage VPB change to an equal voltage.

In this manner, in the voltage detection apparatus 220 of the first comparative example, when the first and second differential voltage detection circuits 25A and 25B are both faulty, a voltage difference does not occur between the first capacitor voltage VPA and the second capacitor voltage VPB. Therefore, faults in the first and second differential voltage detection circuits 25A and 25B themselves cannot be determined based on the first and second differential voltages VA and VB.

Here, in the voltage detection apparatus 220 of the first comparative example, when the first and second differential voltage detection circuits 25A and 25B are connected to the capacitor VA to operate with the same polarity, a voltage difference does not occur between the first differential voltage VA and the second differential voltage VB regardless of a presence/absence of faults in the first and second differential voltage detection circuits 25A and 25B. Therefore, faults in the first and second differential voltage detection circuits 25A and 25B themselves cannot be determined based on the first and second differential voltages VA and VB.

Figure 8:
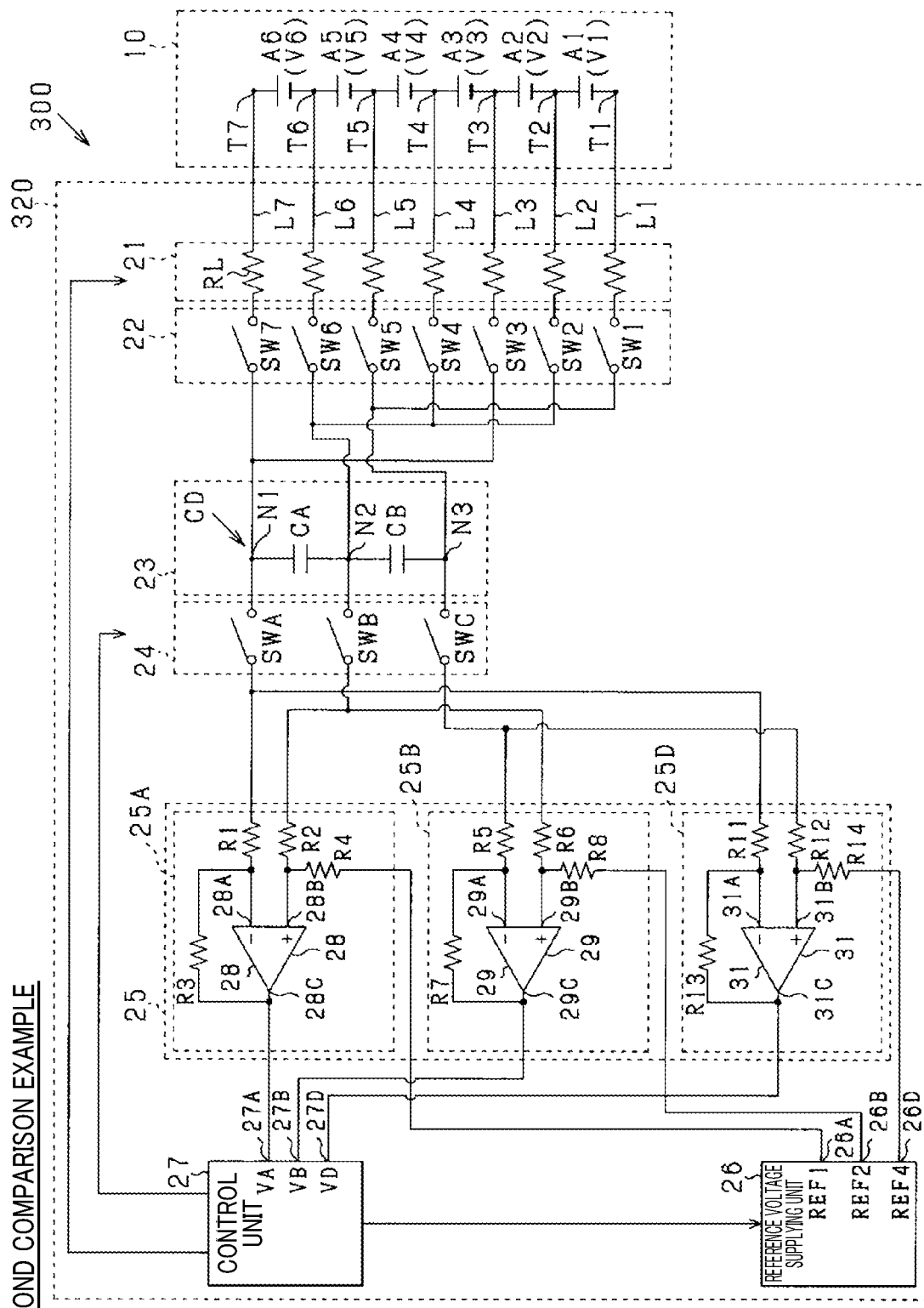
FIG. 8 is a diagram of a power supply system of a second comparative example.

FIG. 8 shows a power supply system 300 of a second comparative example. The power supply system 300 includes a double-flying-capacitor-type voltage detection apparatus 320. The voltage detection apparatus 320 differs from the voltage detection apparatus 20 according to the present embodiment in that the capacitor unit 23 has the capacitor CA and a capacitor CB that are connected in series. First and third terminals N1 and N3 are provided as connection terminals in end portions of the series-connection body of the capacitors CA and CB. In addition, a second terminal N is provided as a connection terminal between the capacitors CA and CN. The electrode terminals Tn of the assembled battery 10 are connected to one of the terminals N1 to N3 by the switches SWn.

Specifically, the third and seventh electrode terminals T3 and T7, among the first to seventh electrode terminals T1 to T7, are connected to the first terminal N1. The second, fourth, and sixth electrode terminals T2, T4, and T6 are connected to the second terminal N2. The first and fifth electrode terminals T1 and T5 are connected to the third terminal N3.

In addition, the voltage detection apparatus 320 differs in that the output-side switch unit 24 includes switches SWA to SWC. The switches SWA to SWC are respectively connected to the first to third terminals N1 to N3 of the capacitors CA and CB. Specifically, the switch SWA is connected to the first terminal N1. The switch SWB is connected to the second terminal N2. The switch SWC is connected to the third terminal N3. The switches SWA and SWB open and close between the capacitor CA and the detecting unit 25. The switches SWB and SWC open and close between the capacitor CB and the detecting unit 25. The switches SWA and SWC open and close between a composite capacitor CD of the capacitor CA and the capacitor CB, and the detecting unit 25.

Furthermore, the voltage detection apparatus 320 differs in that the detecting unit 25 does not include the voltage follower circuit 25C. Moreover, the voltage detection apparatus 320 differs in that, in the first differential voltage detection circuit 25A, the negative-electrode-side input terminal 28A is connected to the first terminal N1 of the capacitor CA by the switch SWA, and the positive-electrode-side input terminal 28B is connected to the second terminal N2 of the capacitor CA by the switch SWB.

In addition, the voltage detection apparatus 320 differs in that, in the second differential voltage detection circuit 25B, the negative-electrode-side input terminal 29A is connected to the third terminal N3 of the capacitor CB by the switch SWC, and the positive-electrode-side input terminal 29B is connected to the second terminal N2 of the capacitor CB by the switch SWB. The second differential voltage detection circuit 25B differs in that the voltage of the capacitor CB is amplified by the second amplification factor.

Furthermore, the voltage detection apparatus 320 differs in that a third differential voltage detection circuit 25D is provided. The third differential voltage detection circuit 25D is a differential amplification circuit. The third differential voltage detection circuit 25D includes a fourth operational amplifier 31 and eleventh to fourteenth resistors R11 to R14.

A negative-electrode-side input terminal 31A of the fourth operational amplifier 31 is connected to the first terminal N1 of the composite capacitor CD with the eleventh resistor R11 therebetween, and connected to an output terminal 31C of the fourth operational amplifier 31 with the thirteenth resistor R13 therebetween. The positive-electrode-side input terminal 31B of the fourth operational amplifier 31 is connected to the third terminal N3 of the composite capacitor CD with the twelfth resistor R12 therebetween, and connected to a fourth output terminal 26D of the reference voltage supplying unit 26 with the fourteenth resistor R14 therebetween. A fourth reference voltage REF4 is supplied to the positive-electrode-side input terminal 31B from the reference voltage supplying unit 26.

The third differential voltage detection circuit 25D amplifies a voltage of the composite capacitor CD by a predetermined third amplification factor. Specifically, the third differential voltage detection circuit 25D amplifies the voltage of the composite capacitor CD to a third differential voltage VD that is within a predetermined third output range Z3 that is set within a voltage range from 0 V to 5 V (see FIG. 9). The third differential voltage VD changes within the third output range Z3 based on changes in the voltage of the capacitor CA. The output terminal 31C is connected to a fourth input terminal 27D of the control unit 27. The third differential voltage detection circuit 25D outputs the third differential voltage VD to the fourth input terminal 27D of the control unit 27.

In addition, the voltage detection apparatus 320 differs in that, in the reference voltage supplying unit 26, the first output terminal 26A and the second output terminal 26B are closely arranged, and the second output terminal 26B is positioned between the first output terminal 26A and the fourth output terminal 26D. In a similar manner, the voltage detection apparatus 320 differs in that, in the control unit 27, the first input terminal 27A and the second input terminal 27B are closely arranged, and the second input terminal 27B is positioned between the first input terminal 27A and the fourth input terminal 27D.

Figure 9:
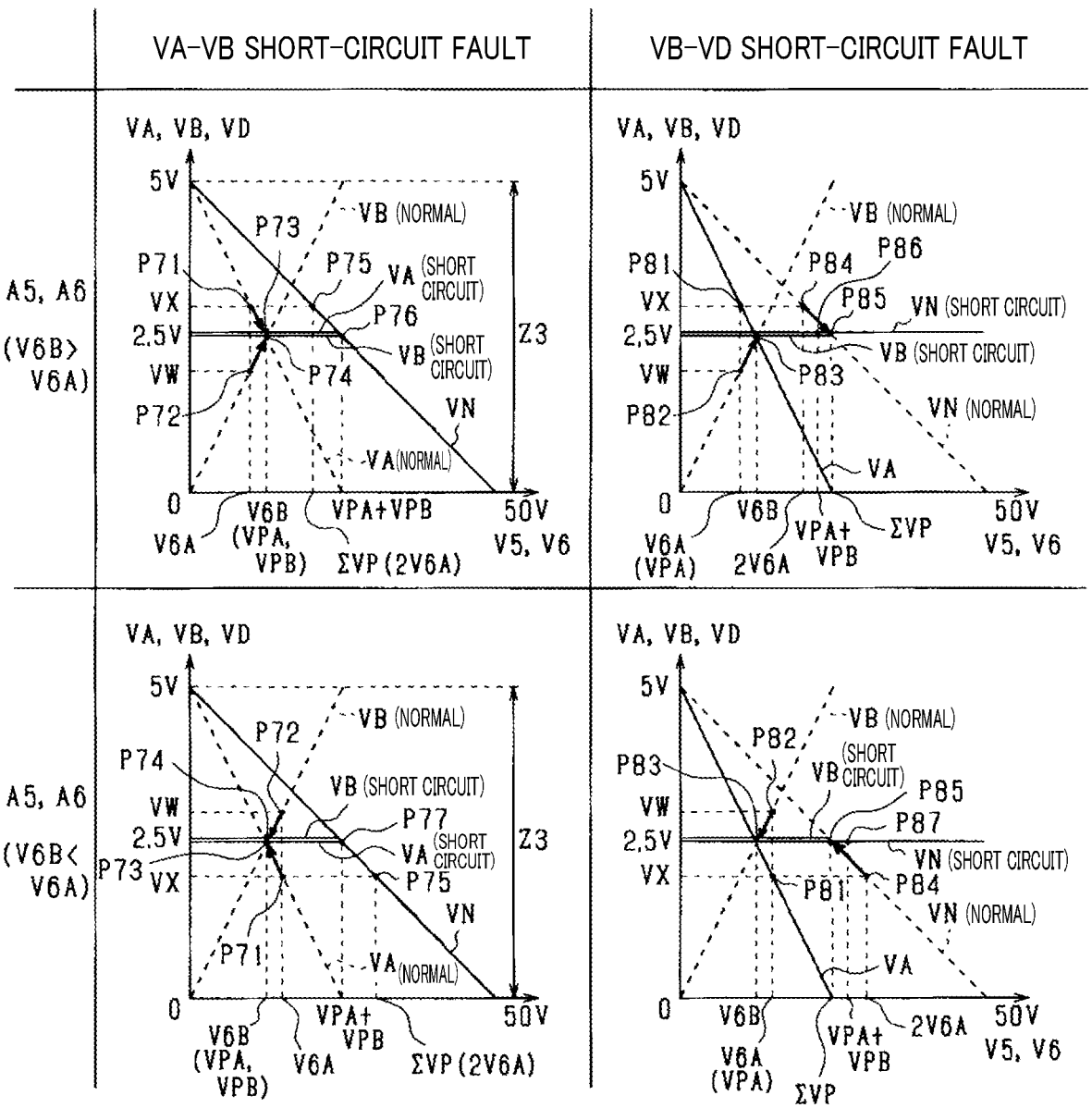
FIG. 9 is a diagram of specific correlations in the second comparative example.

FIG. 9 shows a specific correlation when the second differential voltage detection circuit 25B is faulty in the second comparative example. A fault in the second differential voltage detection circuit 25B includes a short-circuit fault between the first differential voltage detection circuit 25A and the second differential voltage detection circuit 25B, and a short-circuit fault between the second differential voltage detection circuit 25B and the third differential voltage detection circuit 25D.

The short-circuit fault between the first differential voltage detection circuit 25A and the second differential voltage detection circuit 25B may, for example, be a VA-VB short-circuit fault. In addition, the short-circuit fault between the second differential voltage detection circuit 25B and the third differential voltage detection circuit 25D may, for example, be a short-circuit fault between the second input terminal 27B and the fourth input terminal 27D in the control unit 27 (referred to, hereafter, as a VB-VD short-circuit fault). FIG. 9 shows a specific correlation when the VA-VB short-circuit fault or the VB-VD short-circuit fault occurs.

As shown by a solid line or a broken line in FIG. 9, the specific correlations of the first to third differential voltages VA, VB, and VD when the first to third differential voltage detection circuits 25A, 25B, and 25D are all normal are that in which, when the capacitors CB and CA are charged by the fifth and sixth detection blocks A5 and A6, the first differential voltage VA decreases as the voltage V6 of the sixth detection block A6 increases.

In addition, the second differential voltage VB increases as the voltage of the fifth detection block A5 increases. Furthermore, the third differential voltage VD decreases as the voltages of the fifth and sixth detection blocks A5 and A6 increase. Here, in the power supply system 300 of the second comparative example, the rated voltage of the detection block A is, for example, 25 V.

First, regarding the VA-VB short-circuit fault, a case in which the capacitor CB is charged by the fifth detection block A5 and the capacitor CA is charged by the sixth detection block A6 will be described.

As shown in FIG. 9, when the VA-VB short-circuit fault occurs, because the impedances at the output terminals 28C and 29C of the first and second operational amplifiers 28 and 29 are substantially equal, the specific correlations of the first and second differential voltages VA and VB change in a following manner. Specifically, the specific correlations of the first and second differential voltages VA and VB are that in which, when the capacitors CA and CB are charged by the fifth and sixth detection blocks A5 and A6, the first and second differential voltages VA and VB are 2.5 V regardless of the voltages V5 and V6 of the fifth and sixth detection blocks A5 and A6.

Therefore, when the actual voltage V6 of the sixth detection block A6 is V6A, as indicated by a point P71, the first differential voltage VA that corresponds to the first differential voltage detection circuit 25A that is normal is assumed to be VX. At this time, when the VA-VB short-circuit fault occurs, the first differential voltage VA that corresponds to the first differential voltage detection circuit 25A in which a fault has occurred changes from VX to 2.5 V. As a result, regardless of the voltage V6 of the sixth detection block A6 being V6A, the first capacitor voltage VPA that indicates the voltage V6 of the sixth detection block A6 is calculated as V6B as indicated by a point P73.

In addition, as indicated by a point P72, the second differential voltage VB that corresponds to the second differential voltage detection circuit 25B that is normal is assumed to be VW. At this time, when the VA-VB short-circuit fault occurs, the second differential voltage VB that corresponds to the second differential voltage detection circuit 25B in which a fault has occurred changes from VW to 2.5 V. As a result, regardless of the voltage V6 of the sixth detection block A6 being V6A, the second capacitor voltage VPB that indicates the voltage V6 of the sixth detection block A6 is calculated as V6B as indicated by a point P74.

Here, the third differential voltage detection circuit 25D is normal. Therefore, as indicated by a point P75, the third differential voltage VD that corresponds to the third differential voltage detection circuit 25D is VX. A total voltage ΣVP of the capacitors CA and CB calculated from the third differential voltage VD is a value that is a two-fold of V6A (2V6A, where V6=V5 is assumed herein).

As shown in an upper row in FIG. 9, when V6B is greater than V6A, an added value of the first and second capacitor voltages VPA and VPB is greater than the total voltage ΣVP of the capacitors CA and CB, as indicated by a point P76. Meanwhile, as shown in a lower row in FIG. 9, when V6B is less than V6A, the added value of the first and second capacitor voltages VPA and VPB is less than the total voltage ΣVP of the capacitors CA and CB, as indicated by a point P77.

That is, in the VA-VB short-circuit fault, a voltage difference occurs between the added value of the first and second capacitor voltages VPA and VPB, and the total voltage ΣVP of the capacitors CA and CB, regardless of a magnitude relationship between V6A and V6B. Here, in the VA-VB short-circuit fault, when V6B is greater than V6A, the added value of the first and second capacitor voltages VPA and VPB is greater than the total voltage ΣVP of the capacitors CA and CB. In addition, when V6B is less than V6A, the added value of the first and second capacitor voltages VPA and VPB is less than the total voltage ΣVP of the capacitors CA and CB.

Next, regarding the VB-VD short-circuit fault, a case in which the capacitor CB is charged by the fifth detection block A5 and the capacitor CA is charged by the sixth detection block A6 will be described. When the VB-VD short-circuit fault occurs, because the impedances at the output terminals 29C and 31C of the second and third operational amplifiers 29 and 31 are substantially equal, the specific correlations of the second and third differential voltages VB and VD change in a following manner. Specifically, the specific correlations of the second and third differential voltages VB and VD are that in which, when the capacitors CA and CB are charged by the fifth and sixth detection blocks A5 and A6, the second and third differential voltages VB and VD are 2.5 V regardless of the voltages V5 and V6 of the fifth and sixth detection blocks A5 and A6.

Therefore, when the actual voltage V6 of the sixth detection block A6 is V6A, as indicated by a point P82, the second differential voltage VB that corresponds to the second differential voltage detection circuit 25B that is normal is assumed to be VW. At this time, when the VB-VD short-circuit fault occurs, the second differential voltage VB that corresponds to the second differential voltage detection circuit 25B in which a fault has occurred changes from VW to 2.5 V. As a result, regardless of the voltage V6 of the sixth detection block A6 being V6A, the second capacitor voltage VPB that indicates the voltage V6 of the sixth detection block A6 is calculated as V6B as indicated by a point P83.

In addition, as indicated by a point P84, the third differential voltage VD that corresponds to the third differential voltage detection circuit 25D that is normal is assumed to be VX. At this time, when the VB-VD short-circuit fault occurs, the third differential voltage VD that corresponds to the third differential voltage detection circuit 25D in which a fault has occurred changes from VX to 2.5 V. As a result, regardless of the total voltage $\Sigma$VP of the capacitors CA and CB being 2V6A, a change from 2V6A occurs as indicated by a point P85.

Here, the first differential voltage detection circuit 25A is normal. Therefore, as indicated by a point P81, the first differential voltage is VX, and the first capacitor voltage VPA is V6A.

As shown in the upper row in FIG. 9, when V6B is greater than V6A, the added value of the first and second capacitor voltages VPA and VPB is less than the total voltage $\Sigma$VP of the capacitors CA and CB, as indicated by a point P86. In addition, as shown in the lower row in FIG. 9, when V6B is less than V6A, the added value of the first and second capacitor voltages VPA and VPB is greater than the total voltage $\Sigma$VP of the capacitors CA and CB, as indicated by a point P87.

That is, in the VB-VD short-circuit fault, a voltage difference occurs between the added value of the first and second capacitor voltages VPA and VPB, and the total voltage $\Sigma$VP of the capacitors CA and CB, regardless of the magnitude relationship between V6A and V6B. Here, in the VB-VD short-circuit fault, when V6B is greater than V6A, the added value of the first and second capacitors VPA and VPB is less than the total voltage $\Sigma$VP of the capacitors CA and CB. In addition, when V6B is less than V6A, the added value of the first and second capacitors VPA and VPB is greater than the total voltage $\Sigma$VP of the capacitors CA and CB.

In this manner, in the voltage detection apparatus 320 of the second comparative example, when the second differential voltage detection circuit 25B is faulty, a voltage difference occurs between the added value of the first and second capacitor voltages VPA and VPB, and the total voltage $\Sigma$VP of the capacitors CA and CB. Therefore, a determination can be made that the second differential voltage detection circuit 25B is faulty when this voltage difference occurs.

Meanwhile, a magnitude relationship between the added value of the first and second capacitor voltages VPA and VPB, and the total voltage $\Sigma$VP of the capacitors CA and CB changes based on a type of short-circuit fault that has occurred and the magnitude relationship between V6B and V6A. Therefore, the type of short-circuit fault, that is, which of the circuits 25A and 25B is faulty cannot be determined using the magnitude relationship between the added value of the first and second capacitor voltages VPA and VPB, and the total voltage $\Sigma$VP of the capacitors CA and CB.

According to the present embodiment described in detail above, following effects can be achieved.

According to the present embodiment, in the reference voltage supplying unit 26, the third output terminal 26C is positioned between the first output terminal 26A and the second output terminal 26B. Occurrence of a short circuit between the first output terminal 26A and the second output terminal 26B can be suitably suppressed. In addition, in the control unit 27, the third input terminal 27C is positioned between the first input terminal 27A and the second input terminal 27B. Occurrence of a short circuit between the first input terminal 27A and the second input terminal 27B can be suitably suppressed.

Meanwhile, for example, the first output terminal 26A and the third output terminal 26C may be short-circuited. The first reference voltage REF1 that is supplied from the first output terminal 26A and the third reference voltage REF3 that is supplied from the third output terminal 26C are set to differing voltages. Therefore, when the first output terminal 26A and the third output terminal 26C are short-circuited, the first reference voltage REF1 changes and the first differential voltage VA changes as a result.

In this case, because the second output terminal 26B is not short-circuited, the second differential voltage VB does not change. That is, only either voltage of the first and second differential voltages VA and VB changes. Therefore, the fault in the first differential voltage detection circuit 25A can be appropriately determined based on the first and second differential voltages VA and VB. Here, this similarly applies to a short circuit between the second output terminal 26B and the third output terminal 26C, and a short circuit between the first input terminal 27A or the second input terminal 27B and the third input terminal 27C.

That is, in the voltage detection apparatus 20 according to the present embodiment, a fault in the first differential voltage detection circuit 25A or the second differential voltage detection circuit 25B can be determined based on the first and second differential voltages VA and VB. Therefore, the voltage detection apparatus 20 according to the present embodiment is superior to the voltage detection apparatus 220 of the first comparative example in which faults in the first differential voltage detection circuit 25A and the second differential voltage detection circuit 25B themselves cannot be determined based on the first and second differential voltages VA and VB.

According to the present embodiment, the output voltage VC is not used in fault determination regarding the first and second differential voltage detection circuit 25A and 25B. Therefore, in the fault determination process, the output voltage VC is not required to be acquired. Issues caused by the output voltage VC being acquired, such as decrease in fault determination speed due to increase in processing load on the control unit 27, can be suppressed.

According to the present embodiment, the circuits 25A to 25C that configure the detecting unit 25 are configured using the operational amplifiers 28 to 30. As a result, in the reference voltage supplying unit 26, the impedances at the first to third output terminals 26A to 26C are substantially equal. In addition, in the first to third operational amplifiers 28 to 30 that are connected to the first to third input terminals 27A to 27C, the impedances at the output terminals 28C to 30C are substantially equal.

Therefore, for example, when the first output terminal 26A and the third output terminal 26C are short-circuited, the first reference voltage REF1 changes to an intermediate voltage of the first reference voltage REF1 and the third reference voltage REF3 when a short circuit has not occurred. Therefore, for example, when a voltage difference between the first reference voltage REF1 and the third reference voltage REF3 when the above-described short circuit has not occurred is large, an amount of change in the first reference voltage REF1 can be increased, and the fault in the first differential voltage detection circuit 25A can be appropriately determined.

According to the present embodiment, the negative-electrode-side input terminals 28A and 29A of the first and second operational amplifiers 28 and 29 are connected to the first terminal N1 of the capacitor CA. The positive-electrode-side input terminals 28B and 29B are connected to the second terminal N2 of the capacitor CA. That is, the first and second differential voltage detection circuits 25A and 25B are connected to the capacitor CA such as to operate with the same polarity.

Therefore, compared to a case in which the first and second differential voltage detection circuits 25A and 25B operate with opposite polarities, when either voltage of the first and second differential voltages VA and VB changes as a result of a fault in the first or second differential voltage detection circuit 25A or 25B, the voltage change can be accurately detected.

According to the present embodiment, the input-side switch unit 22 is connected to the detection blocks A1 to A6 and the capacitor CA, such that the polarity of the voltage of the capacitor CA switches between the positive polarity and the negative polarity. As a result, compared to a case in which detection blocks A1 to A6 and the capacitor CA are connected such that the polarity of the voltage of the capacitor is kept fixed, the switches SWn that configure the input-side switch unit 22 can be reduced. This is advantageous for cost reduction.

According to the present embodiment, when the polarity of the voltage of the capacitor CA switches between the positive polarity and the negative polarity, the first to third reference voltages REF1 to REF3 are switched in correspondence thereto. As a result, faults in the first and second differential voltage detection circuits 25A and 25B can be determined by the same fault determination process, regardless of the polarity of the voltage of the capacitor CA.

In addition, when the first to third reference voltages REF1 to REF3 are switched, the first and second reference voltages REF1 and REF2, and the third reference voltage REF3 are set to voltages on opposite sides in relation to the output ranges Z1 and Z2. Therefore, an amount of change in either voltage of the first and second differential voltages VA and VB that occurs as a result of a fault in the first or second differential voltage detection circuit 25A or 25B can be increased.

According to the present embodiment, when the first differential voltage detection circuit 25A is faulty, the first capacitor voltage VPA is changed to a voltage that is greater than the second capacitor voltage VPB. When the second differential voltage detection circuit 25B is faulty, the second capacitor voltage VPB is changed to a voltage that is greater than the first capacitor voltage VPA. Therefore, which of the differential voltage detection circuits 25A and 25B is faulty can be determined using the magnitude relationship between the first capacitor voltage VPA and the second capacitor voltage VPB. As a result, this is advantageous for replacement of faulty differential voltage detection circuits 25A and 25B, and the like.

In the voltage detection apparatus 20 according to the present embodiment, which of the differential voltage detection circuits 25A and 25B is faulty can be determined using the magnitude relationship between the first capacitor voltage VPA and the second capacitor voltage VPB. Therefore, the voltage detection apparatus 20 according to the present embodiment is superior to the voltage detection apparatus 320 of the second comparative example in which the type of short-circuit fault cannot be determined using the added value of the first and second capacitor voltages VPA and VPB, and the total voltage $\Sigma$VP of the capacitors CA and CB.

Second Embodiment

Figure 10:
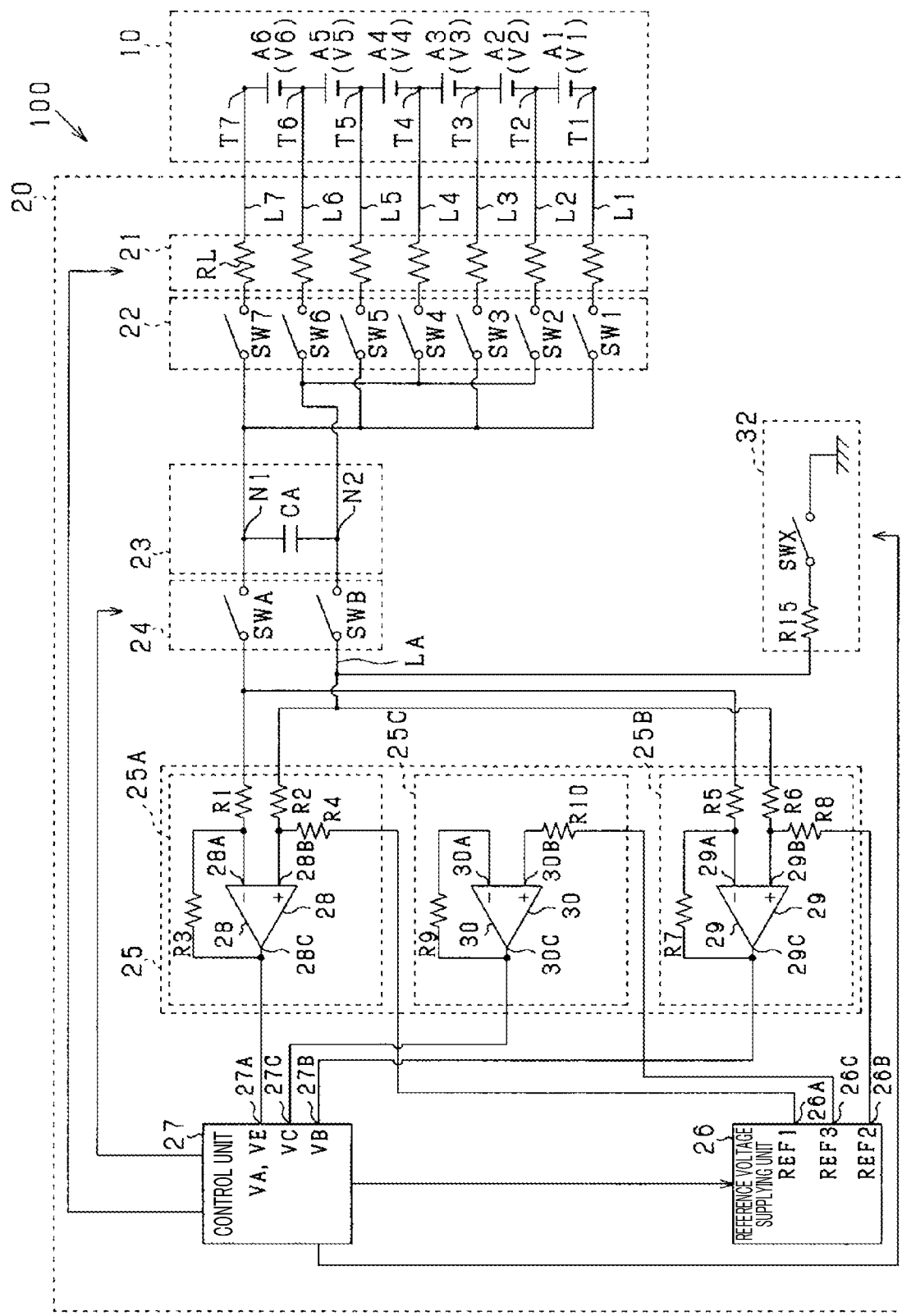
FIG. 10 is a diagram of a power supply system according to a second embodiment.
Figure 11:
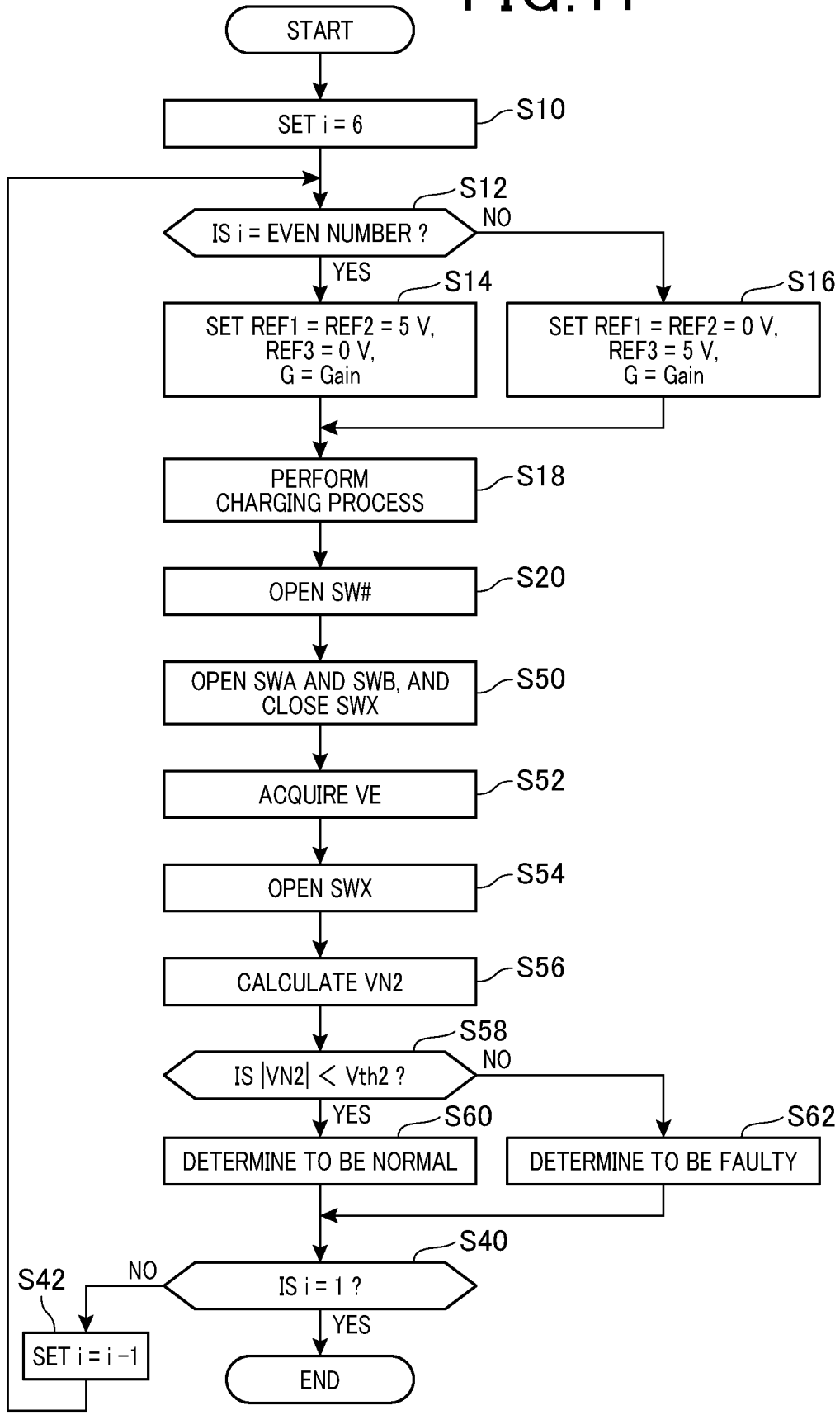
FIG. 11 is a flowchart of the steps in a fault determination process according to the second embodiment.

A second embodiment will be described below with reference to FIGS. 10 and 11, mainly focusing on differences with the first embodiment, above. In FIG. 10, components that are identical to components shown in FIG. 1, above, are given the same reference numbers for convenience. Descriptions are omitted. In addition, in FIG. 11, processes that are identical to processes shown in FIG. 2, above, are given the same reference numbers for convenience. Descriptions are omitted.

As shown in FIG. 10, the present embodiment differs from the voltage detection apparatus according to the first embodiment in that the voltage detection apparatus 20 includes an input stabilization circuit 32. The input stabilization circuit 32 is a circuit that applies a ground voltage that serves as a constant voltage to the capacitor CA to stabilize the voltage of the capacitor CA. According to the present embodiment, the input stabilization circuit 32 applies the ground voltage to the second terminal N2 of the capacitor CA. Here, according to the present embodiment, the ground voltage corresponds to a standard voltage. The input stabilization circuit 32 corresponds to a voltage application circuit.

The input stabilization circuit 32 is connected to a connection line LA that connects the switch SWB, and the first and second differential voltage detection circuits 25A and 25B. The input stabilization circuit 32 includes an application switch SWX and a fifteenth resistor R15. The application switch SWX and the fifteenth resistor R15 are connected in series in this order between the connection line LA and the ground.

The application switch SWX opens and closes between the connection line LA and the ground. As a result of the application switch SWX being set to the closed state, a state is such that the ground voltage is applied to the second terminal N2 of the capacitor CA through the switch SWX. In addition, as a result of the application switch SWX being set to the open state, a state is such that the ground voltage is not connected to the above-described electrode. That is, the application switch SWX switches between a state in which the ground voltage is applied to the second terminal N2 of the capacitor CA through the switch SWX and a state in which the ground voltage is not applied.

The control unit 27 controls opening/closing of the application switch SWX. When the switches SWA and SWB are set to the open state and the application switch SWX is set to the closed state, the control unit 27 acquires the voltage that is outputted from the first differential voltage detection circuit 25A. Here, because the switches SWA and SWB are in the open state, referring to this voltage as the first differential voltage VA is not appropriate.

Therefore, the voltage that is outputted from the first differential voltage detection circuit 25A when the switches SWA and SWB are in the open state, and the application switch SWX is in the closed state is referred to hereafter as a determination voltage VE. The control unit 27 performs a fault determination process to determine a fault in the input stabilization circuit 32 based on the ground voltage and the determination voltage VE. Here, according to the present embodiment, the determination voltage VE corresponds to a fourth voltage.

Next, the fault determination process according to the present embodiment will be described with reference to FIG. 11. Here, FIG. 11 is a flowchart of the steps in the above-described process. For example, the process is repeatedly performed at a predetermined cycle by the control unit 27. Here, at the start of the fault determination process, the switches SWn, the switches SWA and SWB, and the application switch SWX are switched to the open state.

According to the present embodiment, at step S14, the gain G is set to Gain that is a positive value. In addition, when the target switch SW # is switched to the open state at step S20, at step S50, the switches SWA and SWB are switched to the open state, and the application switch SWX is switched to the closed state. At subsequent step S52, the determination voltage VE is acquired. After acquisition of the determination voltage VE, at step S54, the application switch SWX is switched to the open state.

When the application switch SWX is switched to the open state, at step S56, an electrode voltage VN2 that is a voltage at the second terminal N2 of the capacitor CA is calculated using the determination voltage VE acquired at step S52. The electrode voltage VN2 is expressed such as by a following (expression 3) using the gain G.

$$VN2=(VE-REF1)/G+REF1 \quad \text{(expression 3)}$$

At subsequent step S58, whether an absolute value of the electrode voltage VN2 calculated at step S56 is less than a predetermined second determination threshold Vth2 is determined. Hereafter, the determination threshold Vth described according to the first embodiment is referred to as a first determination threshold Vth1.

Here, the second determination threshold Vth2 is set in advance to a maximum value of the absolute value of the electrode voltage VE that may be generated by a voltage acquisition error in the control unit 27. The second determination threshold Vth2 is set based on the ground voltage. Specifically, when the input stabilization circuit 32 is normal, the electrode voltage VN2 is substantially 0 V. Therefore, the second determination threshold Vth2 is set to a minute voltage that corresponds to the voltage acquisition error in the control unit 27.

When an affirmative determination is made at step S58, at step S60, the control 27 determines that the input stabilization circuit 32 is normal and proceeds to step S40. Meanwhile, when a negative determination is made at step S58, at step S62, the control unit 27 determines that the input stabilization circuit 32 is faulty and proceeds to step S40.

According to the present embodiment described above, when the input stabilization circuit 32 is normal, the determination voltage VE is substantially 0 V as a result of grounding. Meanwhile, when the input stabilization circuit 32 is faulty, such as by an open fault in the application switch SWX, the determination voltage VE becomes unstable and deviates from substantially 0 V. Therefore, when the determination voltage VE is not substantially 0 V, a determination can be made that the input stabilization circuit 32 is faulty.

Third Embodiment

Figure 12:
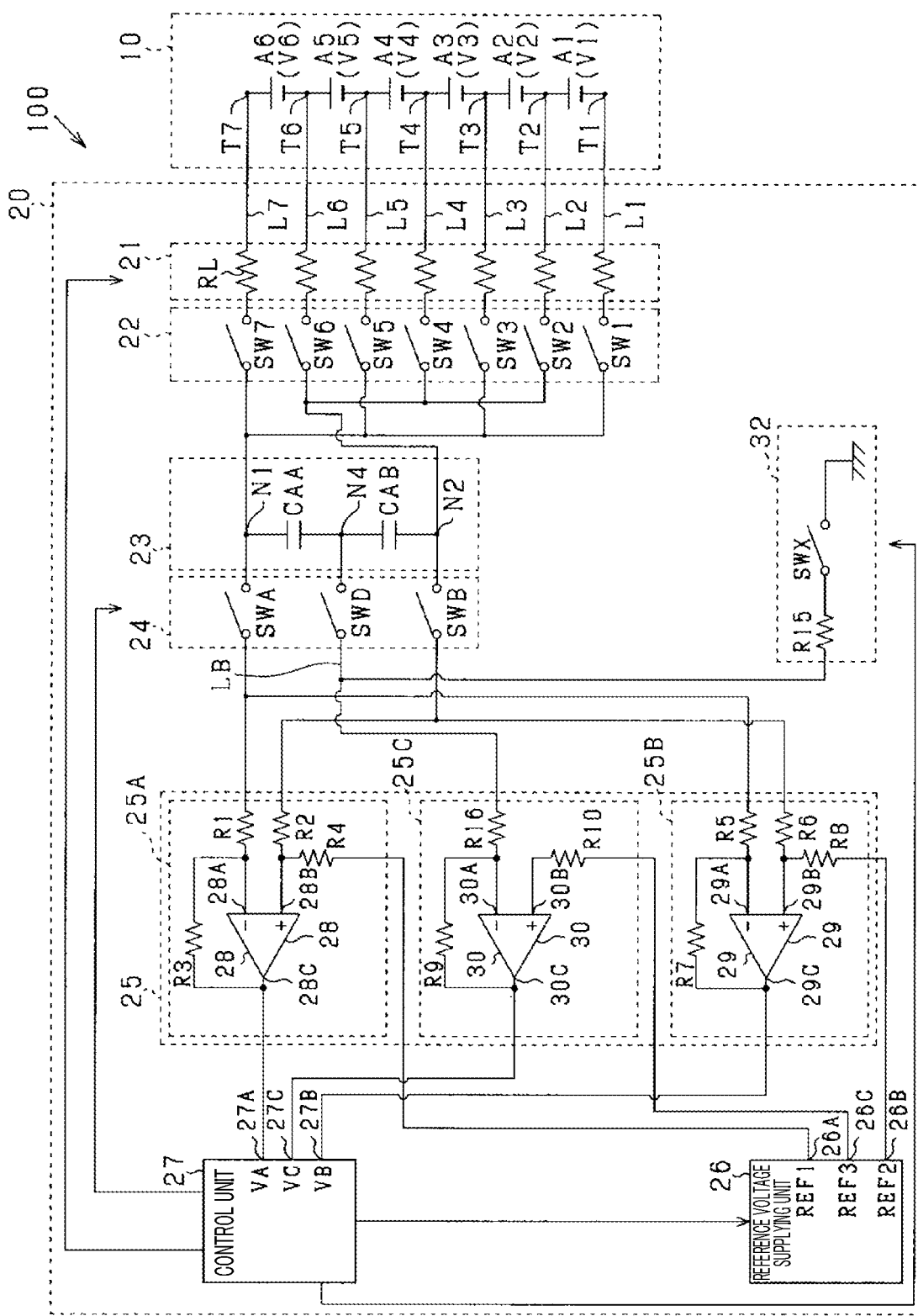
FIG. 12 is a diagram of a power supply system according to a third embodiment.
Figure 13:
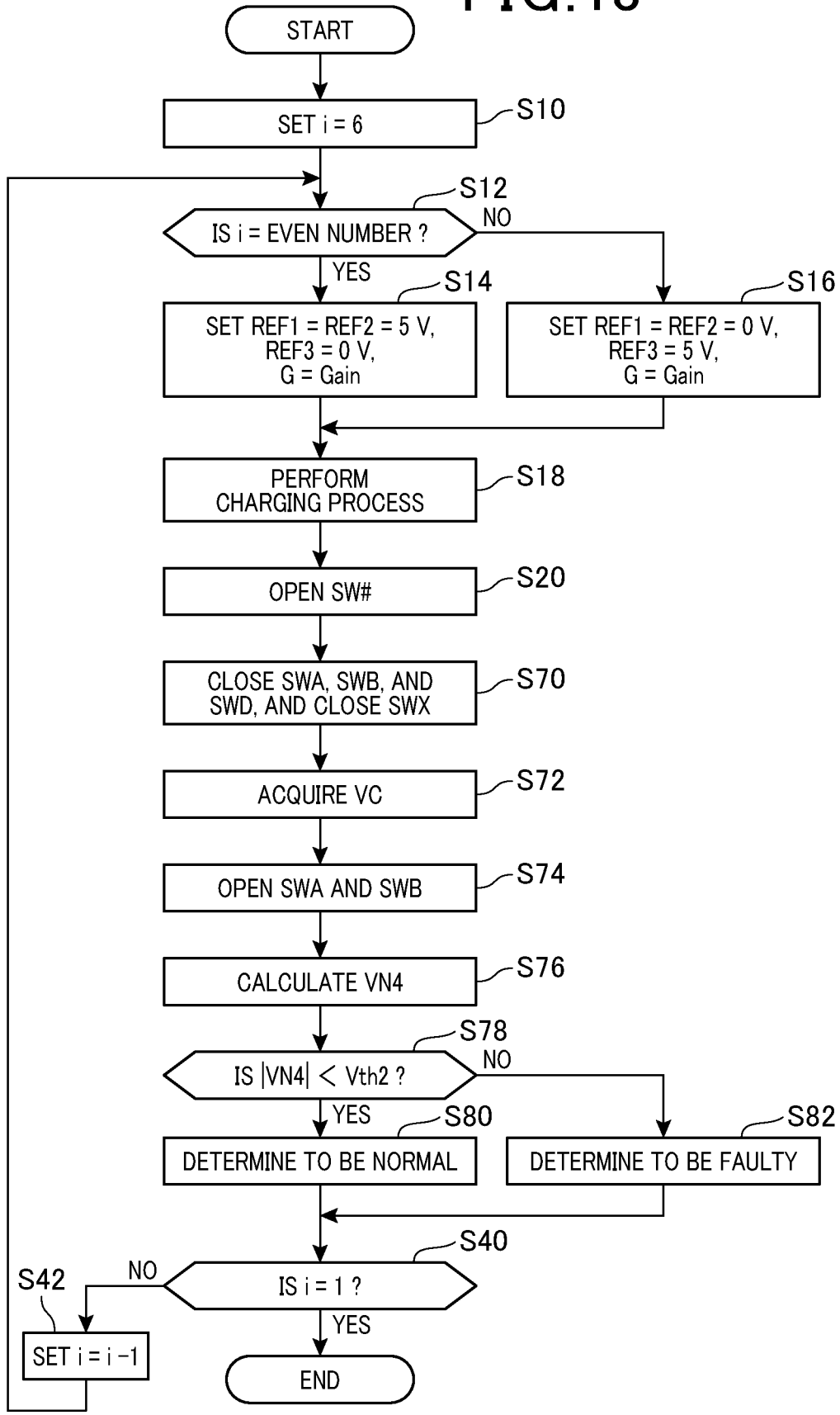
FIG. 13 is a flowchart of the steps in a fault determination process according to the third embodiment.

A third embodiment will be described below with reference to FIGS. 12 and 13, mainly focusing on differences with the second embodiment, above. In FIG. 12, components that are identical to components shown in FIG. 1, above, are given the same reference numbers for convenience. Descriptions are omitted. In addition, in FIG. 13, processes that are identical to processes shown in FIGS. 2 and 11, above, are given the same reference numbers for convenience. Descriptions are omitted.

As shown in FIG. 12, the present embodiment differs from the voltage detection apparatus according to the second embodiment in that the capacitor unit 23 includes a first capacitor CAA and a second capacitor CAB that are connected in series. A fourth terminal N4 is provided as a connection terminal between the first and second capacitors CAA and CAB. The fourth terminal N4 connects the first capacitor CAA and the second capacitor CAB. Here, according to the present embodiment, the fourth terminal N4 corresponds to a connection point.

In addition, the present embodiment differs in that the output-side switch unit 24 includes a switch SWD in addition to the switches SWA and SWB. A first contact of the switch SWD is connected to the fourth terminal N4 and a second contact is connected to the voltage follower circuit 25C. According to the present embodiment, the input stabilization circuit 32 is connected to a connection line LB that connects the switch SWD and the voltage follower circuit 25C.

Furthermore, the present embodiment differs in that the voltage follower circuit 25C includes a sixteenth resistor R16. The positive-electrode-side input terminal 30B of the third operational amplifier 30 is connected to the fourth terminal N4 of the capacitor CA by the sixteenth resistor R16.

According to the present embodiment, the input stabilization circuit 32 applies the ground voltage to the fourth terminal N4 of the capacitor CA. The application switch SWX opens and closes between the connection line LB and the ground. As a result of the application switch SWX being set to the closed state, a state is such that the ground voltage is applied to the fourth terminal N4 of the capacitor CA through the switch SWD.

In addition, as a result of the application switch SWX being set to the open state, a state is such that the ground is not connected to the fourth terminal N4. That is, the application switch SWX switches between a state in which the ground voltage is applied to the fourth terminal N4 of the capacitor CA and a state in which the ground voltage is not applied.

When the switches SWA, SWB, and SWD are in the closed state, and the application switch SWX is in the closed state, the control unit 27 acquires the output voltage VC that is outputted from the voltage follower circuit. 25C The control unit 27 performs a fault determination process to determine a fault in the input stabilization circuit 32 based on the ground voltage and the output voltage VC.

Next, the fault determination process according to the present embodiment will be described with reference to FIG. 13. Here, FIG. 13 is a flowchart of the steps in the above-described process. For example, the process is repeatedly performed at a predetermined cycle by the control unit 27. Here, at the start of the fault determination process, the switches SWn, the switches SWA, SWB, and SWD, and the application switch SWX are switched to the open state.

According to the present embodiment, at step S14, the gain G is set to Gain that is a positive value. In addition, when the target switch SW # is set to the open state at step S20, at step S70, the switches SWA, SWB, and SWD are switched to the closed state, and the application switch SWX is switched to the closed state. At subsequent step S72, the output voltage VC is acquired. After acquisition of the output voltage VC, at step S74, the switches SWA and SWB are switched to the open state.

When the switches SWA and SWB are switched to the open state, at step S76, a terminal voltage VN4 that is a voltage at the fourth terminal N4 of the capacitor CA is calculated using the output voltage VC acquired at step S72. The terminal voltage VN4 is expressed such as by a following (expression 4) using the gain G.

$$VN4=(VC-REF3)/G+REF3 \quad \text{(expression 4)}$$

At subsequent step S78, whether an absolute value of the terminal voltage VN4 calculated at step S76 is less than the predetermined second determination threshold Vth2 is determined. When an affirmative determination is made at step S78, at step S80, the control unit 27 determines that the input stabilization circuit 32 is normal and proceeds to step S40. Meanwhile, when a negative determination is made at step S78, at step S82, the control unit 27 determines that the input stabilization circuit 32 is faulty and proceeds to step S40.

According to the present embodiment described above, when the input stabilization circuit 32 is normal, the output voltage VC is substantially 0 V as a result of grounding. Meanwhile, when the input stabilization circuit 32 is faulty, such as by an open fault in the application switch SWX, the output voltage VC becomes unstable and deviates from substantially 0 V. Therefore, when the output voltage VC is not substantially 0 V, a determination can be made that the input stabilization circuit 32 is faulty.

According to the present embodiment, when the fault in the input stabilization circuit 32 is determined, the polarity of the voltage of the capacitor unit 23 is switched between the positive polarity and the negative polarity. As a result, shifts in characteristics in the voltage follower circuit 25C when the voltage of the capacitor unit 23 has the positive polarity and shifts in characteristics in the voltage follower circuit 25C when the voltage of the capacitor unit has the negative polarity can each be detected.

OTHER EMBODIMENTS

The present disclosure is not limited to the descriptions according to the above-described embodiments and may be carried out in a following manner.

According to the above-described embodiments, an example in which the assembled battery 10 includes six detection blocks A is given. However, this is not limited thereto. Two or more and less than five detection blocks A may be provided. Alternatively, seven or more detection blocks A may be provided.

In addition, the same number of battery cells is assumed regarding the detection blocks A1 to A6. However, differing numbers of cells are also possible.

According to the above-described embodiments, an example in which the current limiting resistance RL is provided on the detection line Ln is given. However, the current limiting resistance RL is not necessarily required to be provided.

According to the above-described embodiments, an example in which the first and second differential voltage detection circuits 25A and 25B are differential amplification circuits is given. However, this is not limited thereto. For example, the first and second differential voltage detection circuits 25A and 25B may be differential circuits that output the voltage of the capacitor CA without amplification.

According to the above-described embodiments, an example in which the voltage output circuit is the voltage follower circuit 25C is given. However, this is not limited thereto. The voltage output circuit is merely required to be a circuit in which input impedances are substantially equal and output impedances are substantially equal, in relation to the first and second differential voltage detection circuits 25A and 25C. For example, the voltage output circuit may be a differential amplification circuit According to the above-described embodiments, an example in which the first differential voltage detection circuit and the second differential voltage detection circuit operate with the same polarity is given. However, the first differential voltage detection circuit and the second differential voltage detection circuit may operate with opposite polarities. Even in a case in which the first differential voltage detection circuit and the second differential voltage detection circuit operate with opposite polarities, for example, when the first output terminal 26A and the third output terminal 26C are short-circuited, only either voltage of the first and second differential voltages VA and VB changes. Therefore, a fault in the first differential voltage detection circuit 25A can be appropriately determined based on the first and second differential voltages VA and VB.

According to the above-described embodiments, an example in which the first and second reference voltages REF1 and REF2, and the third reference voltages REF3 are set to voltages on opposite sides in relation to the output ranges Z1 and Z2 is given. However, this is not limited thereto. The third reference voltage REF3 is merely required to be set to a voltage that differs from the first and second reference voltages REF1 and REF2. For example, when the third reference voltage REF3 is set to 2.5 V, the third reference voltage REF3 is not necessarily required to be switched.

According to the above-described second embodiment, an example in which the input stabilization circuit 32 is connected to the connection line LA that connects the switch SWB, and the first and second differential voltage detection circuits 25A and 25B is given. However, this is not limited thereto. The input stabilization circuit 32 may be connected to a connection line that connects the switch SWA, and the first and second differential voltage detection circuits 25A and 25B.

According to the above-described second embodiment, an example in which, when a fault in the input stabilization circuit 32 is determined, the voltage that is outputted from the first differential voltage detection circuit 25A is acquired is given. However, this is not limited thereto. A voltage that is outputted from the second differential voltage detection circuit 25B may be acquired. In this case, the second differential voltage detection circuit 25B corresponds to a first differential voltage detection circuit. In addition, the electrode voltage VN2 is expressed such as by a following (expression 5) using the determination voltage VE that is acquired using the second differential voltage detection circuit 25B.

$$VN2=(VE-REF3)/G+REF3 \quad \text{(expression 5)}$$

According to the above-described second and third embodiments, an example in which the fault determination process regarding the input stabilization circuit 32 is performed separately from the fault determination process regarding the first and second differential voltage detection circuits 25A and 25B is given. However, this is not limited thereto. Fault determination regarding the input stabilization circuit 32, and fault determination regarding the first and second differential voltage detection circuits 25A and 25B may be performed in a single fault determination process.

While the present disclosure has been described with reference to embodiments thereof, it is to be understood that the disclosure is not limited to the embodiments and constructions. The present disclosure is intended to cover various modification examples and modifications within the range of equivalency. In addition, various combinations and configurations, and further, other combinations and configurations including more, less, or only a single element thereof are also within the spirit and scope of the present disclosure.

What is claimed is:

1. A voltage detection apparatus that is applicable to an assembled battery that has a series-connection body of a plurality of battery cells, wherein:
   the plurality of battery cells are divided to configure a plurality of detection blocks;
   the voltage detection apparatus includes
     a capacitor,
     an input-side switch that connects the detection block to the capacitor in parallel, and opens and closes between the detection block and the capacitor,
     a first differential voltage detection circuit that detects a voltage of the capacitor and outputs a first voltage based on the voltage of the capacitor,
     a second differential voltage detection circuit that detects the voltage of the capacitor and outputs a second voltage based on the voltage of the capacitor,
     an output-side switch that opens and closes between the capacitor, and the first differential voltage detection circuit and the second differential voltage detection circuit,
     a reference voltage supplying unit that has a plurality of output terminals, supplies a first reference voltage to the first differential voltage detection circuit from a first output terminal among the plurality of output terminals, and supplies a second reference voltage to the second differential voltage detection circuit from a second output terminal,
     a fault determining unit that has a plurality of input terminals, in which the first voltage is inputted to a first input terminal among the plurality of input terminals and the second voltage is inputted to a second input terminal, and that determines a fault in the first differential voltage detection circuit or the second differential voltage detection circuit based on the first voltage and the second voltage, and
     a voltage output circuit that is supplied a third reference voltage from a third output terminal that is positioned between the first output terminal and the second output terminal in the reference voltage supplying unit, among the plurality of output terminals, and outputs a third voltage to a third input terminal that is positioned between the first input terminal and the second input terminal in the fault determining unit, among the plurality of input terminals; and
   the third reference voltage is set to a voltage that differs from each of the first reference voltage and the second reference voltage, and the third voltage is set to a voltage that differs from each of the first voltage and the second voltage.

2. The voltage detection apparatus according to claim 1, wherein:
   the voltage output circuit is a voltage follower circuit.

3. The voltage detection apparatus according to claim 2, wherein:
   the first differential voltage detection circuit and the second differential voltage detection circuit have positive-electrode-side input terminals and negative-electrode-side input terminals; and
   the output-side switch connects a first electrode of the capacitor to the negative-electrode-side input terminals of the first differential voltage detection circuit and the second differential voltage detection circuit, and connects a second electrode of the capacitor to the positive-electrode-side input terminals of the first differential voltage detection circuit and the second differential voltage detection circuit.

4. The voltage detection apparatus according to claim 3, wherein:
   the first voltage and the second voltage change within a predetermined output range based on changes in the voltage of the capacitor;
   the input-side switch connects between the detection block and the capacitor such that a polarity of the voltage of the capacitor switches between a positive polarity and a negative polarity; and
   the reference voltage supplying unit sets the first reference voltage and the second reference voltage to a voltage on a lower-limit side of the output range and sets the third reference voltage to a voltage on an upper-limit side of the output range when the polarity of the voltage of the capacitor is the positive polarity, and sets the first reference voltage and the second reference voltage to a voltage on the upper-limit side of the output range and sets the third reference voltage to a voltage on the lower-limit side of the output range when the polarity of the voltage of the capacitor is the negative polarity.

5. The voltage detection apparatus according to claim 4, wherein:
   the fault determining unit determines that the first differential voltage detection circuit is faulty when a first capacitor voltage that is the voltage of the capacitor calculated using the first voltage is greater than a second capacitor voltage that is the voltage of the capacitor calculated using the second voltage, and determines that the second differential voltage detection circuit is faulty when the first capacitor voltage is less than the second capacitor voltage.

6. The voltage detection apparatus according to claim 5, further comprising:
   a voltage application circuit that applies a standard voltage to either electrode of the capacitor, wherein
   the voltage application circuit is connected to a connection line that connects the output-side switch and the first differential voltage detection circuit, and has an application switch that switches between a state in which the standard voltage is applied to either electrode through the output-side switch and a state in which the standard voltage is not applied,
   the first differential voltage detection circuit outputs a fourth voltage when the output-side switch is in an open state and the application switch is in a closed state, and
   the fault determining unit determines a fault in the voltage application circuit based on the fourth voltage and the standard voltage.

7. The voltage detection apparatus according to claim 5, wherein:
   the capacitor has a first capacitor and a second capacitor that are connected in series;

a connection point that connects the first capacitor and the second capacitor is connected to an input terminal of the voltage output circuit to which the third reference voltage is supplied;

the voltage detection apparatus includes a voltage application circuit that applies a standard voltage to the connection point;

the voltage application circuit has an application switch that switches between a state in which the standard voltage is applied to the connection point and a state in which the standard voltage is not applied; and the fault determining unit determines a fault in the voltage application circuit based on the third voltage and the standard voltage when the application switch is in a closed state.

8. The voltage detection apparatus according to claim 1, wherein:

the first differential voltage detection circuit and the second differential voltage detection circuit have positive-electrode-side input terminals and negative-electrode-side input terminals; and the output-side switch connects a first electrode of the capacitor to the negative-electrode-side input terminals of the first differential voltage detection circuit and the second differential voltage detection circuit, and connects a second electrode of the capacitor to the positive-electrode-side input terminals of the first differential voltage detection circuit and the second differential voltage detection circuit.

9. The voltage detection apparatus according to claim 8, wherein:

the first voltage and the second voltage change within a predetermined output range based on changes in the voltage of the capacitor;

the input-side switch connects between the detection block and the capacitor such that a polarity of the voltage of the capacitor switches between a positive polarity and a negative polarity; and the reference voltage supplying unit sets the first reference voltage and the second reference voltage to a voltage on a lower-limit side of the output range and sets the third reference voltage to a voltage on an upper-limit side of the output range when the polarity of the voltage of the capacitor is the positive polarity, and sets the first reference voltage and the second reference voltage to a voltage on the upper-limit side of the output range and sets the third reference voltage to a voltage on the lower-limit side of the output range when the polarity of the voltage of the capacitor is the negative polarity.

10. The voltage detection apparatus according to claim 9, wherein:

the fault determining unit determines that the first differential voltage detection circuit is faulty when a first capacitor voltage that is the voltage of the capacitor calculated using the first voltage is greater than a second capacitor voltage that is the voltage of the capacitor calculated using the second voltage, and determines that the second differential voltage detection circuit is faulty when the first capacitor voltage is less than the second capacitor voltage.

11. The voltage detection apparatus according to claim 1, further comprising:

a voltage application circuit that applies a standard voltage to either electrode of the capacitor, wherein the voltage application circuit is connected to a connection line that connects the output-side switch and the first differential voltage detection circuit, and has an application switch that switches between a state in which the standard voltage is applied to either electrode through the output-side switch and a state in which the standard voltage is not applied, the first differential voltage detection circuit outputs a fourth voltage when the output-side switch is in an open state and the application switch is in a closed state, and the fault determining unit determines a fault in the voltage application circuit based on the fourth voltage and the standard voltage.

12. The voltage detection apparatus according to claim 1, wherein:

the capacitor has a first capacitor and a second capacitor that are connected in series;

a connection point that connects the first capacitor and the second capacitor is connected to an input terminal of the voltage output circuit to which the third reference voltage is supplied;

the voltage detection apparatus includes a voltage application circuit that applies a standard voltage to the connection point;

the voltage application circuit has an application switch that switches between a state in which the standard voltage is applied to the connection point and a state in which the standard voltage is not applied; and the fault determining unit determines a fault in the voltage application circuit based on the third voltage and the standard voltage when the application switch is in a closed state.

* * * * *